(12) United States Patent
Bok et al.

(10) Patent No.: US 12,219,786 B2
(45) Date of Patent: Feb. 4, 2025

(54) DISPLAY APPARATUS

(71) Applicant: Samsung Display Co., Ltd., Yongin-si (KR)

(72) Inventors: Seunglyong Bok, Yongin-si (KR); Byounghun Sung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 472 days.

(21) Appl. No.: 17/523,597

(22) Filed: Nov. 10, 2021

(65) Prior Publication Data
US 2022/0173341 A1 Jun. 2, 2022

(30) Foreign Application Priority Data
Nov. 12, 2020 (KR) .................. 10-2020-0151117

(51) Int. Cl.
| | |
|---|---|
| *H10K 50/115* | (2023.01) |
| *H10K 50/844* | (2023.01) |
| *H10K 50/856* | (2023.01) |
| *H10K 59/122* | (2023.01) |
| *H10K 59/38* | (2023.01) |
| *H10K 59/40* | (2023.01) |

(52) U.S. Cl.
CPC ......... *H10K 50/115* (2023.02); *H10K 50/844* (2023.02); *H10K 50/856* (2023.02); *H10K 59/122* (2023.02); *H10K 59/38* (2023.02); *H10K 59/40* (2023.02)

(58) Field of Classification Search
CPC .. H10K 50/115; H10K 50/865; H10K 50/856; H10K 50/844; H10K 59/38; H10K 59/122
See application file for complete search history.

(56) References Cited

U.S. PATENT DOCUMENTS

| | | |
|---|---|---|
| 8,796,702 B2 | 8/2014 | Kim et al. |
| 8,872,206 B2 | 10/2014 | Chung et al. |
| 9,882,169 B2 | 1/2018 | Kim et al. |

(Continued)

FOREIGN PATENT DOCUMENTS

| | | |
|---|---|---|
| CN | 109411522 | 3/2019 |
| KR | 10-2017-0023282 | 3/2017 |
| KR | 10-2019-0000759 | 1/2019 |

*Primary Examiner* — Syed I Gheyas
*Assistant Examiner* — Casey Paul Boatman
(74) *Attorney, Agent, or Firm* — KILE PARK REED & HOUTTEMAN PLLC

(57) ABSTRACT

A display apparatus includes: a lower substrate including a display area and a transmission area; first to third pixel electrodes in the display area; an intermediate layer having an opening corresponding to the transmission area; an opposite electrode above the intermediate layer, and having an opening corresponding to the transmission area; an upper substrate including a first area corresponding to the first pixel electrode, a second area corresponding to the second pixel electrode, a third area corresponding to the third pixel electrode, and a fourth area corresponding to the transmission area; a light-transmissive layer in the first area; a second-color quantum dot layer in the second area; a third-color quantum dot layer in the third area; and a light-transmissive material layer be in the fourth area, and being integrally formed with the light-transmissive layer.

16 Claims, 27 Drawing Sheets

(56) References Cited

U.S. PATENT DOCUMENTS

| | | |
|---|---|---|
| 10,084,147 B2 | 9/2018 | Liu et al. |
| 10,692,417 B2 | 6/2020 | Lee et al. |
| 2012/0104422 A1 | 5/2012 | Lee et al. |
| 2014/0145156 A1 | 5/2014 | Choi et al. |
| 2014/0367646 A1* | 12/2014 | Kim ............... H10K 59/122 257/40 |
| 2019/0286270 A1 | 9/2019 | Bok et al. |
| 2020/0044006 A1* | 2/2020 | Lee ................ H10K 59/12 |
| 2020/0058728 A1* | 2/2020 | Song ............... H10K 59/131 |
| 2020/0144344 A1 | 5/2020 | Wang et al. |
| 2020/0168667 A1* | 5/2020 | Kim ............... H10K 71/00 |
| 2020/0295090 A1* | 9/2020 | Cho ............... H10K 50/865 |
| 2020/0295310 A1* | 9/2020 | Moon ............. H10K 59/1315 |
| 2020/0312916 A1* | 10/2020 | Kim .............. H10K 50/115 |
| 2021/0013284 A1* | 1/2021 | Moon ............. H10K 59/126 |

* cited by examiner

DISPLAY APPARATUS

CROSS-REFERENCE TO RELATED APPLICATIONS

This application claims priority to and the benefit of Korean Patent Application No. 10-2020-0151117, filed Nov. 12, 2020, which is hereby incorporated by reference for all purposes as if fully set forth herein.

BACKGROUND

Field

One or more embodiments relate to display apparatuses, and more particularly, to display apparatuses having high light efficiency.

Discussion

Display apparatuses visually display data. Such display apparatuses may be used as displays of small products, such as mobile phones, or may be used as displays of large products, such as televisions.

Display apparatuses include a plurality of pixels that receive electrical signals and emit light to display an image to the outside. Each of the plurality of pixels may include a light-emitting diode. For example, in the case of organic light-emitting display apparatuses, each pixel includes an organic light-emitting diode as a light-emitting diode. In general, organic light-emitting display apparatuses typically include a thin-film transistor and an organic light-emitting diode, which is a display element, formed on a substrate, and the organic light-emitting diode emits light by itself. While applications of display apparatuses have diversified, various design efforts have been made to improve the quality of display apparatuses.

The above information disclosed in this section is only for understanding the background of the inventive concepts, and, therefore, may contain information that does not form prior art.

SUMMARY

A display apparatus according to the related art may have a relatively low luminescent efficiency. As such, one or more embodiments provide a display apparatus capable of having relatively high luminescent efficiency.

Additional aspects will be set forth in the detailed description which follows, and, in part, will be apparent from the disclosure, or may be learned by practice of the inventive concepts.

According to one or more embodiments, a display apparatus includes a lower substrate, first to third pixel electrodes, an intermediate layer, an opposite electrode, an upper substrate, a light-transmissive layer, a second-color quantum dot layer, third-color quantum dot layer, and a light-transmissive material layer. The lower substrate includes a display area and a transmission area. The first to third pixel electrodes are above the lower substrate in the display area. The intermediate layer includes emission layers stacked above each of the first to third pixel electrodes. The intermediate layer has an opening corresponding to the transmission area. The opposite electrode is above the intermediate layer. The opposite electrode has an opening corresponding to the transmission area. The upper substrate has a lower surface above the lower substrate and facing the lower substrate. The upper substrate includes a first area corresponding to the first pixel electrode, a second area corresponding to the second pixel electrode, a third area corresponding to the third pixel electrode, and a fourth area corresponding to the transmission area. The light-transmissive layer is between the upper substrate and the opposite electrode in the first area. The second-color quantum dot layer is between the upper substrate and the opposite electrode in the second area. The third-color quantum dot layer is between the upper substrate and the opposite electrode in the third area. The light-transmissive material layer is between the upper substrate and the lower substrate in the fourth area. The light-transmissive material layer is integrally formed with the light-transmissive layer.

According to one or more embodiments, a display apparatus includes a lower substrate, first to third pixel electrodes, an intermediate layer, an opposite electrode, an upper substrate, a bank, a light-transmissive layer, a second-color quantum dot layer, third-color quantum dot layer, and a light-transmissive material layer. The lower substrate includes a transmission area. The first to third pixel electrodes are above the lower substrate. The intermediate layer includes emission layers stacked above each of the first to third pixel electrodes. The intermediate layer has an opening corresponding to the transmission area. The opposite electrode is above the intermediate layer. The opposite electrode has an opening corresponding to the transmission area. The upper substrate has a lower surface above the lower substrate and facing the lower substrate. The upper substrate includes a first area corresponding to the first pixel electrode, a second area corresponding to the second pixel electrode, a third area corresponding to the third pixel electrode, and a fourth area corresponding to the transmission area. The bank is between the upper substrate and the opposite electrode. The bank has a first opening corresponding to the first area, a second opening corresponding to the second area, a third opening corresponding to the third area, and a fourth opening corresponding to the fourth area. The light-transmissive layer fills the first opening. The second-color quantum dot layer fills the second opening. The third-color quantum dot layer fills the third opening. The light-transmissive material layer fills the fourth opening.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts. In the drawings.

DETAILED DESCRIPTION OF SOME EMBODIMENTS

Figure 1:
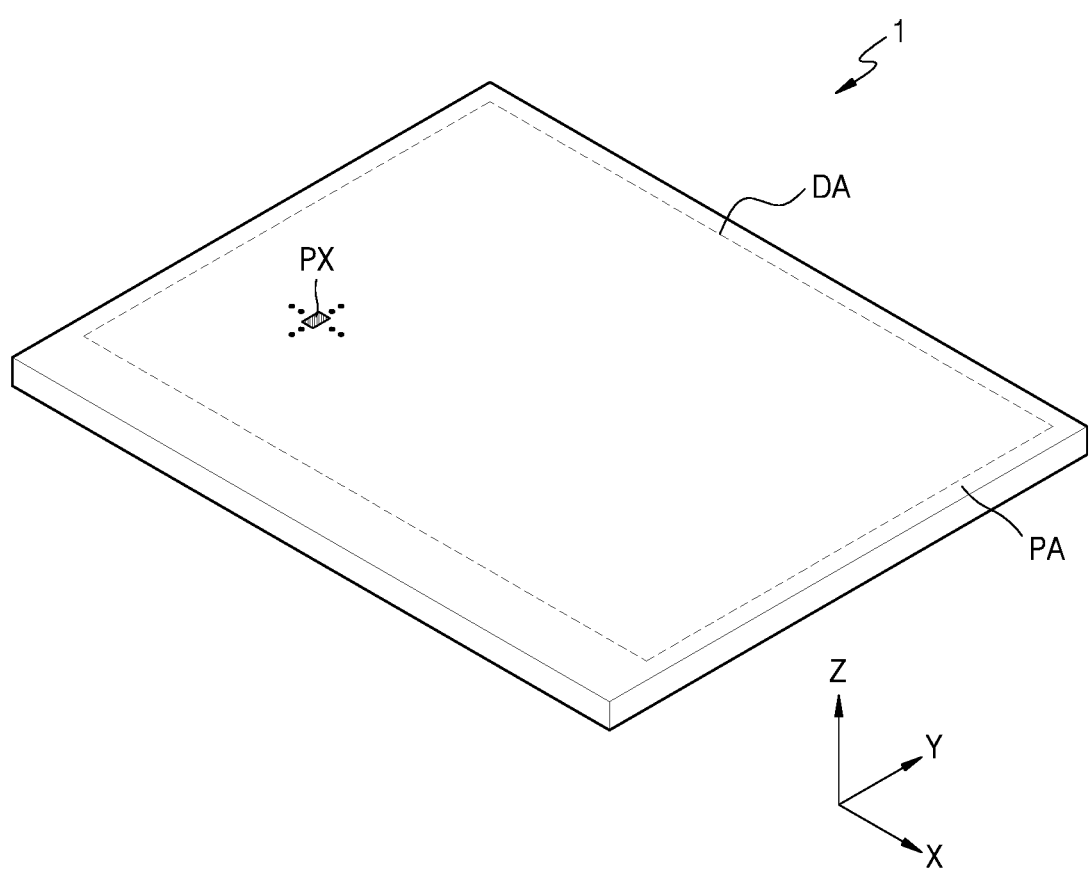
FIG. 1 is a schematic perspective view of a portion of a display apparatus according to an embodiment.

In the following description, for the purposes of explanation, numerous specific details are set forth in order to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

FIG. 1 is a schematic perspective view of a portion of a display apparatus according to an embodiment.

Referring to FIG. 1, a display apparatus 1 according to an embodiment may include a display area DA where light is emitted, and a peripheral area PA where no light is emitted. A lower substrate 100 (see FIG. 2) included in the display apparatus 1 may include an area corresponding to the display area DA and an area corresponding to the peripheral area PA.

FIG. 1 illustrates a case where the display area DA of the display apparatus 1 is rectangular; however, the shape of the display area DA may be any arbitrary shape, such as a circle, an oval, or a polygon.

In the display area DA, pixels PX may be located at intersections between scan lines extending in an x-axis direction and data lines extending in a y-axis direction. Each of the pixels PX may include a pixel circuit connected to a scan line and a data line, and a light-emitting diode connected to the pixel circuit.

The peripheral area PA may be outside the display DA, e.g., the peripheral area PA may surround at least a portion of the display area DA. For example, the peripheral area PA may surround the entire display area DA. Various lines for transmitting electrical signals to the display area DA may be positioned in the peripheral area PA. A portion of a circuit unit for controlling an electrical signal applied to the display area DA may be located in the peripheral area PA.

The peripheral area PA may include a pad area on one side thereof. A pad unit including a plurality of pads may be located on the pad area. The plurality of pads included in the pad unit may receive a signal through a printed circuit board connected to pads of the printed circuit board, respectively. To this end, the pad unit may include a plurality of pads. The plurality of pads may be exposed without being covered by an insulating layer, and may be electrically connected to a printed circuit board or the like.

According to an embodiment, the display apparatus 1 may include a component 40 (see FIG. 11) located on one side thereof. The component 40 may be an electronic element that uses (e.g., detects, outputs, etc.), for instance, light or sounds. For example, an electronic element may be at least one of a sensor that receives and uses light, like an infrared sensor, a camera that receives light and captures an image, a sensor that outputs and senses light or sound to measure a distance or recognize a fingerprint or the like, a small lamp that outputs light, and a speaker that outputs sound.

An organic light-emitting display apparatus is illustrated as an example and will now be described as the display apparatus 1 according to an embodiment. However, display apparatuses according to various embodiments are not limited thereto. For instance, the display apparatus 1 according to some embodiments may be an inorganic light-emitting display, a quantum dot light-emitting display, or the like. For example, an emission layer of a display device included in the display apparatus 1 may include an organic material or may include an inorganic material. The display apparatus 1 may include quantum dots, include an organic material and quantum dots, or include an inorganic material and quantum dots.

Figure 2:
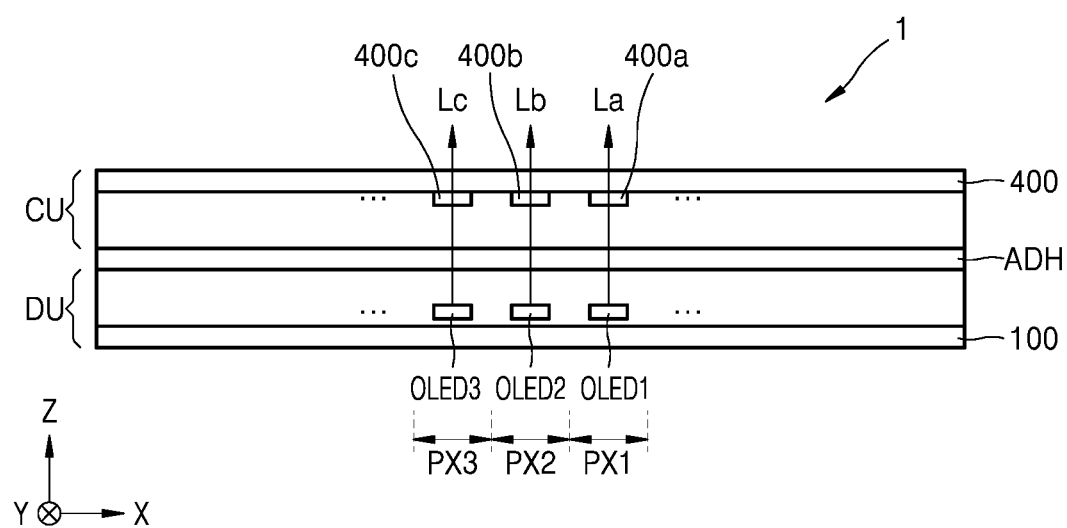
FIG. 2 is a schematic side view of a portion of a display apparatus according to an embodiment.
Figure 3:
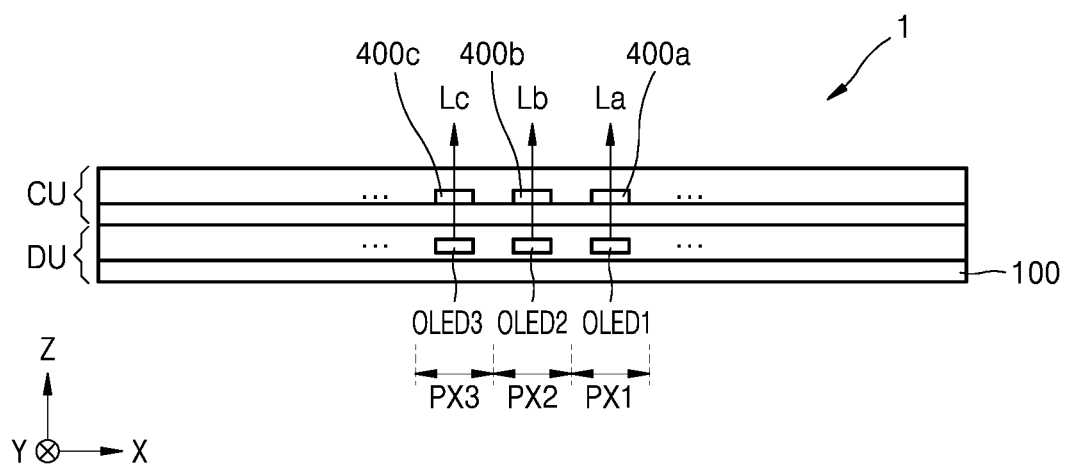
FIG. 3 is a schematic side view of a portion of a display apparatus according to an embodiment.

FIG. 2 is a schematic side view of a portion of a display apparatus according to an embodiment. FIG. 3 is a schematic side view of a portion of a display apparatus according to an embodiment.

Referring to FIG. 2, a display apparatus 1 according to an embodiment may include a display unit DU and a color filter unit CU on, e.g., opposite to, the display unit DU. The display unit DU may include a plurality of pixels. For example, the display unit DU may include a first pixel PX1, a second pixel PX2, and a third pixel PX3. The first pixel PX1, the second pixel PX2, and the third pixel PX3 may be pixels that emit different colors of light and may be disposed on a lower substrate 100. According to an embodiment, the first pixel PX1 may emit first color light La, the second pixel PX2 may emit second color light Lb, and the third pixel PX3 may emit third color light Lc. For example, the first color light La may be blue color light, the second color light Lb may be green color light, and the third color light Lc may be red color light.

Each of the pixels may include a light-emitting diode including an organic light-emitting diode (OLED). For instance, the first pixel PX1 may include a first light-emitting diode OLED1, the second pixel PX2 may include a second light-emitting diode OLED2, and the third pixel PX3 may include a third light-emitting diode OLED3. The first pixel PX1 may include the first light-emitting diode OLED1, the second light-emitting diode OLED2, and the third light-emitting diode OLED3. According to an embodiment, the first through third light-emitting diodes OLED1, OLED2, and OLED3 may emit the first color light La, for example, blue color light. According to another embodiment, the first through third light-emitting diodes OLED1, OLED2, and OLED3 may emit the first color light La, the second color light Lb, and the third color light Lc, respectively. According to another embodiment, the first through third light-emitting diodes OLED1, OLED2, and OLED3 may emit a mixture of the first color light La and the second color light Lb, for example, a mixture of blue color light and green color light.

The color filter unit CU may include first through third color filter portions 400a, 400b, and 400c. Light beams emitted by the first through third light-emitting diodes OLED1, OLED2, and OLED3 may pass through the first through third color filter portions 400a, 400b, and 400c, and thus, the first color light La, the second color light Lb, and the third color light Lc may be emitted.

The first through third color filter portions 400a, 400b, and 400c may be located on (e.g., directly on) an upper substrate 400. In this case, when the first through third color filter portions 400a, 400b, and 400c are located "directly on the upper substrate 400," it may mean that the first through third color filter portions 400a, 400b, and 400c are formed directly on the upper substrate 400 to manufacture the color filter unit CU. The first through third color filter portions 400a, 400b, and 400c may bond the display unit DU with the color filter unit CU by facing the first through third light-emitting diodes OLED1, OLED2, and OLED3, respectively. In FIG. 2, the display unit DU and the color filter unit CU are bonded with each other through an adhesive layer ADH. The adhesive layer ADH may be, but is not limited to, an optical clear adhesive (OCA). According to some embodiments, the adhesive layer ADH may be omitted.

According to another embodiment, as shown in FIG. 3, the first through third color filter portions 400a, 400b, and 400c may be arranged directly on the display unit DU. When the first through third color filter portions 400a, 400b, and 400c are "arranged directly on the display unit DU," it may mean that the first through third color filter portions 400a, 400b, and 400c are stacked directly on the display unit DU and integrated into a single structure, without manufacturing the color filter unit CU separately, as shown in FIG. 3. For instance, the color filter unit CU may be formed through a continuous process with the display unit DU.

Figure 4:
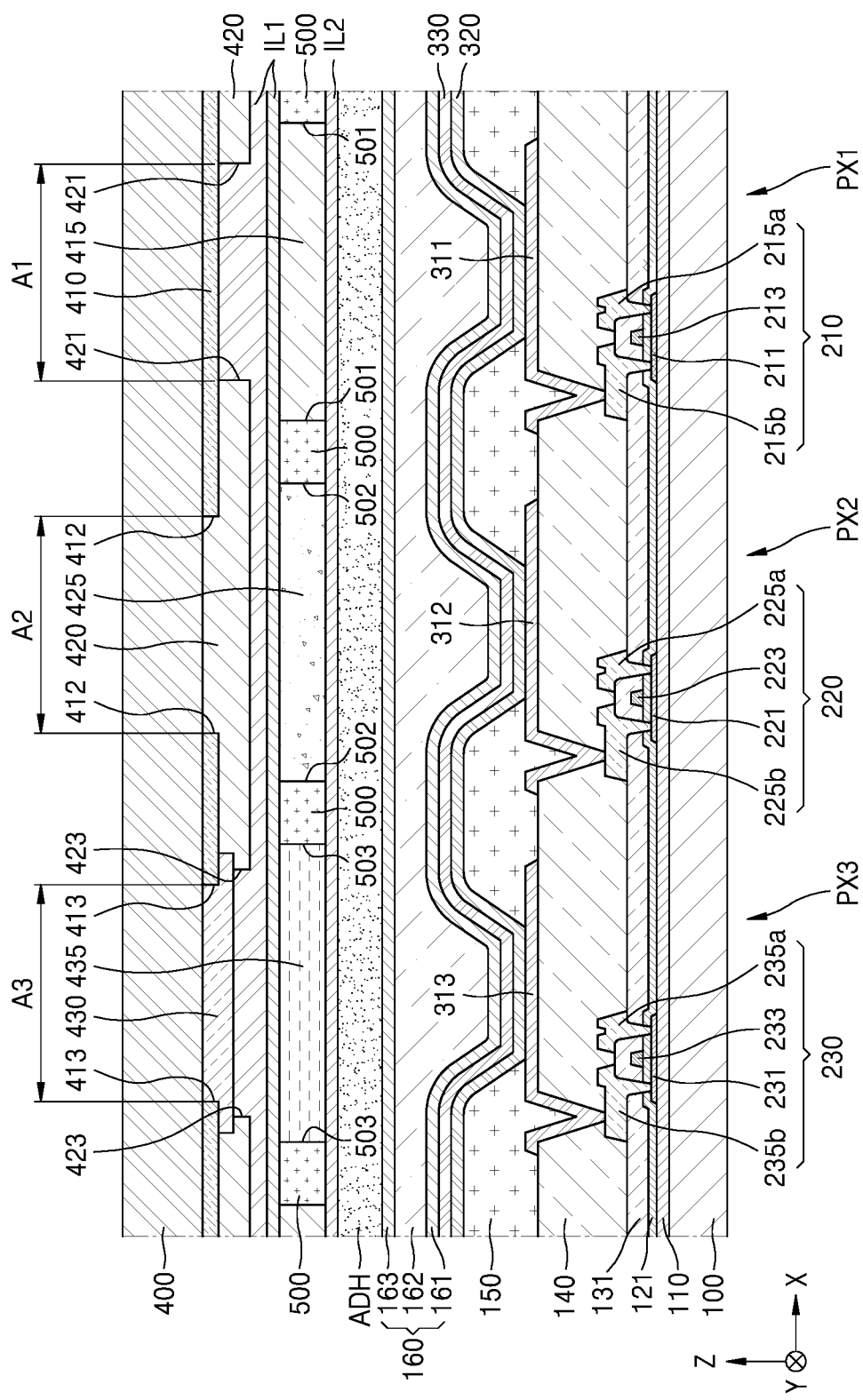
FIG. 4 is a schematic cross-sectional view of a portion of a display apparatus according to an embodiment.

In this case, the first through third color filter portions 400a, 400b, and 400c may be located on an encapsulation layer 160 (see FIG. 4). In some cases, after "another layer" is located between the first through third color filter portions 400a, 400b, and 400c and the encapsulation layer 160, the first through third color filter portions 400a, 400b, and 400c may be formed on the "other layer." The "other layer" may be an organic layer, an inorganic layer, a conductive layer, or a composite layer thereof.

For reference, FIGS. 4 and 5, FIGS. 9 through 16, and FIGS. 21 through 24 are based on the display apparatus 1 in which the display unit DU and the color filter unit CU are bonded with each other as shown in FIG. 2, but contents to be described later are equally applicable to a structure in which color filter portions are stacked on the display unit DU as shown in FIG. 3.

Figure 5:
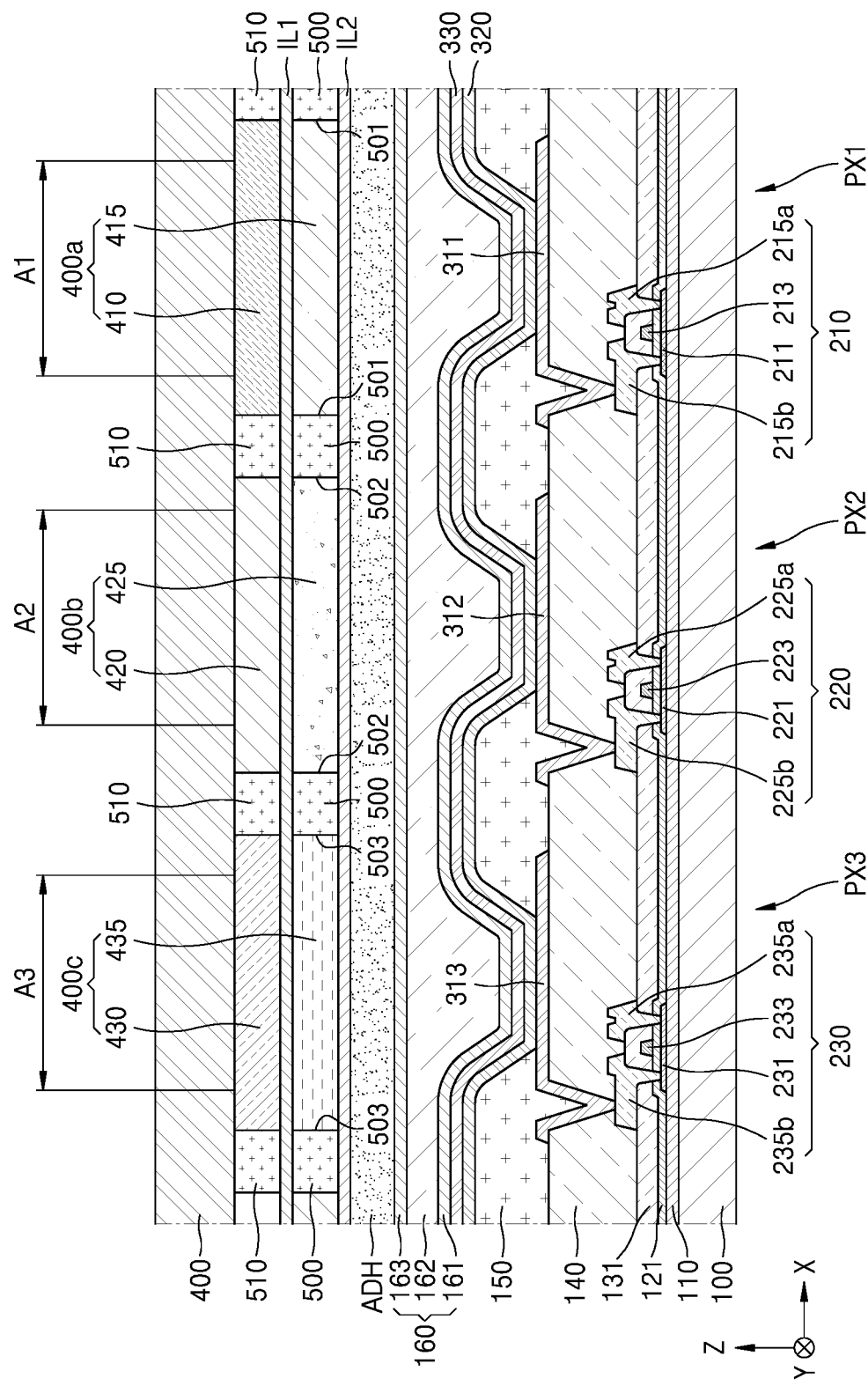
FIG. 5 is a schematic cross-sectional view of a portion of a display apparatus according to an embodiment.

FIG. 4 is a schematic cross-sectional view of a display apparatus according to an embodiment. FIG. 5 is a schematic cross-sectional view of a display apparatus according to an embodiment.

The display apparatus according to an embodiment may include the lower substrate 100, light-emitting diodes located on the lower substrate 100, the upper substrate 400, and color filter portions located on a lower surface of the upper substrate 400 that faces the lower substrate 100.

The lower substrate 100 may include glass, metal, and/or polymer resin. When the lower substrate 100 is flexible or bendable, the upper substrate 400 may include polymer resin, such as at least one of polyethersulfone, polyacrylate, polyetherimide, polyethylene naphthalate, polyethylene terephthalate, polyphenylene sulfide, polyarylate, polyimide, polycarbonate, and cellulose acetate propionate. The lower substrate 100 may have a multi-layered structure including two layers each including a polymer resin and a barrier layer including an inorganic material (e.g., at least one of silicon oxide, silicon nitride, silicon oxynitride, and the like) between the two layers. In this way, various modifications may be made.

A first light-emitting diode including a first pixel electrode 311 is located on the lower substrate 100. A first thin-film transistor 210 electrically connected to the first light-emitting diode, along with the first light-emitting diode, may be located on the lower substrate 100. As shown in FIG. 4, the first light-emitting diode electrically connected to the first thin-film transistor 210 refers to the first pixel electrode 311 of the first light-emitting diode being electrically connected to the first thin-film transistor 210.

The first thin-film transistor 210 may include a first semiconductor layer 211 including amorphous silicon, polycrystalline silicon, an organic semiconductor material, or an oxide semiconductor material, a first gate electrode 213, a first source electrode 215a, and a first drain electrode 215b. The first gate electrode 213 may include any of various conductive materials and may have any of various layered structures. For example, the first gate electrode 213 may include a molybdenum (Mo) layer and an aluminum (Al) layer. In this case, the first gate electrode 213 may have a layered structure of Mo/Al/Mo. Alternatively, the first gate electrode 213 may include a titanium nitride ($TiN_x$) layer, an Al layer, and/or a titanium (Ti) layer. The first source electrode 215a and the first drain electrode 215b may include any of various conductive materials and may have any of various layered structures. For example, each of the first source electrode 215a and the first drain electrode 215b may include a Mo layer, an Al layer, and/or a copper (Cu) layer. In this case, each of the first source electrode 215a and the first drain electrode 215b may have a layered structure of Ti/Al/Ti.

To secure insulation between the first semiconductor layer 211 and the first gate electrode 213, a gate insulating layer 121 may be between the first semiconductor layer 211 and the first gate electrode 213. The gate insulating layer 121 may include an inorganic material, such as silicon oxide, silicon nitride, and/or silicon oxynitride. An interlayer insulating layer 131 may be located on the first gate electrode 213 and may include an inorganic material, such as silicon oxide, silicon nitride, and/or silicon oxynitride. The first source electrode 215a and the first drain electrode 215b may be located on the interlayer insulating layer 131. An insulating layer including such an inorganic material may be formed via chemical vapor deposition (CVD) or atomic layer deposition (ALD). This is equally applied to embodiments to be described later and modifications thereof.

A buffer layer 110 may be between the first thin-film transistor 210 having this structure and the lower substrate 100 and may include an inorganic material, such as, silicon oxide, silicon nitride, and/or silicon oxynitride. The buffer layer 110 may increase smoothness of an upper surface of the lower substrate 100 and/or prevent or minimize infiltration of impurities from the lower substrate 100 and the like into the first semiconductor layer 211 of the first thin-film transistor 210.

A planarization layer 140 may be located on the first thin-film transistor 210. For example, when an OLED as a first light-emitting diode is located over the first thin-film transistor 210 as illustrated in FIG. 4, a planarization layer 140 may planarize an upper portion of a protective layer that covers the first thin-film transistor 210. The planarization layer 140 may include an organic material, such as acryl, benzocyclobutene (BCB), hexamethyldisiloxane (HMDSO), and/or the like. Although the planarization layer 140 is a single layer in FIG. 4, various modifications may be made to the planarization layer 140. For example, the planarization layer 140 may be a stack of multiple layers.

A first light-emitting diode may be located on the planarization layer 140 of the lower substrate 100. In FIG. 4, an OLED as a first light-emitting diode is located on the planarization layer 140. A first light-emitting diode located in a first pixel PX1 may be an OLED having the first pixel electrode 311, an opposite electrode 330, and an intermediate layer 320 between the first pixel electrode 311 and the opposite electrode 330 and including a first color emission layer. The first pixel electrode 311 contacts one of the first source electrode 215a and the first drain electrode 215b via an opening formed in the planarization layer 140 as shown in FIG. 4, and is electrically connected to the first thin-film transistor 210. The first pixel electrode 311 may include a light-transmissive conductive layer formed of a light-transmissive conductive oxide, such as indium tin oxide (ITO), diindium trioxide ($In_2O_3$), or indium zinc oxide (IZO), and a reflective layer formed of a metal such, as Al or silver (Ag), but embodiments are not limited thereto. For example, the first pixel electrode 311 may have a three-layered structure of ITO/Ag/ITO.

The intermediate layer 320 including the first color emission layer may have a shape patterned to correspond to the first pixel electrode 311. However, as shown in FIG. 4, the intermediate layer 320 may be also located on a second pixel electrode 312 and a third pixel electrode 313 located on the lower substrate 100, and thus, may be integrally formed over the first through third pixel electrodes 311 through 313. The opposite electrode 330 on the intermediate layer 320 may also be integrally formed over the first through third pixel electrodes 311 through 313. The opposite electrode 330 may include a light-transmissive conductive layer formed of, for instance, ITO, $In_2O_3$, or IZO, and may also include a semi-transmissive layer including a metal, such as Al or Ag. For example, the opposite electrode 330 may be a semi-transmissive layer including magnesium (Mg) and Ag.

A pixel definition layer 150 may be located on the planarization layer 140. The pixel definition layer 150 defines each pixel by including an opening corresponding to each pixel, e.g., an opening via which a central portion of the first pixel electrode 311 is exposed. In such a case as illustrated in FIG. 4, the pixel definition layer 150 prevents an arc or the like from occurring on the edge of the first pixel electrode 311 by increasing a distance between the edge of the first pixel electrode 311 and the opposite electrode 330. The pixel definition layer 150 may include an organic material, for example, polyimide or HMDSO, but embodiments are not limited thereto.

The intermediate layer 320 may include a low-molecular weight or high-molecular weight material. When the intermediate layer 320 includes a low-molecular weight material, the intermediate layer 320 may have a single-layer or multi-layer stack structure including at least one of a hole injection layer (HIL), a hole transport layer (HTL), an emission layer (EML), an electron transport layer (ETL), and an electron injection layer (EIL), and may be formed via, for example, vacuum deposition. When the intermediate layer 320 includes a high-molecular weight material, the intermediate layer 320 may have a structure including an HTL and an EML. In this case, the HTL may include poly(3,4-ethylenedioxythiophene) (PEDOT), and the EML may include a high-molecular weight material, such as a polyphenylene vinylene (PPV)-based material or a polyfluorene-based material, but embodiments are not limited thereto. The intermediate layer 320 may be formed via screen printing, inkjet printing, deposition, laser induced thermal imaging (LITI), or the like. The intermediate layer 320 is not limited to the structure described above, and may have any of various other structures. According to an embodiment, the intermediate layer 320 may further include a plurality of EMLs and a charge generation layer (CGL) between the EMLs. A detailed description thereof will be given later with reference to FIGS. 6 and 7.

The intermediate layer 320 may include an integrated layer covering the first through third pixel electrodes 311, 312, and 313 as described above. However, in some cases, the intermediate layer 320 may include a layer patterned in correspondence with each of the first through third pixel electrodes 311, 312, and 313. In any case, the intermediate layer 320 includes a first color emission layer EMLa (see FIG. 6). The first color emission layer EMLa may be integrated to cover the first through third pixel electrodes 311, 312, and 313, or, in some cases, may be patterned in correspondence with each of the first through third pixel electrodes 311, 312, and 313. The first color emission layer EMLa may emit light in a first wavelength band. For example, the first color emission layer EMLa may emit light having a wavelength ranging between about 450 nm and about 495 nm.

At least because the above-described OLED may be easily damaged by external moisture, external oxygen, or the like, the OLED may be covered and protected by an encapsulation layer 160. The encapsulation layer 160 may include at least one organic encapsulation layer and at least one inorganic encapsulation layer. For example, the encapsulation layer 160 may include a first inorganic encapsulation layer 161, an organic encapsulation layer 162, and a second inorganic encapsulation layer 163.

The first inorganic encapsulation layer 161 may cover the opposite electrode 330 and may include a silicon oxide, a silicon nitride, and/or silicon oxynitride. Other layers, such as a capping layer, may be located between the first inorganic encapsulation layer 161 and the opposite electrode 330. At least because the first inorganic encapsulation layer 161 is formed according to a structure below the first inorganic encapsulation layer 161, and thus, has an upper surface which is not flat, the organic encapsulation layer 162 may be formed to cover the first inorganic encapsulation layer 161 so as to provide a flat upper surface. The organic encapsulation layer 162 may include at least one material from among polyethylene terephthalate, polyethylene naphthalate, polycarbonate, polyimide, polyethylene sulfonate, polyoxymethylene, polyarylate, and hexamethyldisiloxane, but embodiments are not limited thereto. The second inorganic encapsulation layer 163 may cover the organic encapsulation layer 162 and may include silicon oxide, silicon nitride, and/or silicon oxynitride.

Even when cracks occur in the encapsulation layer 160 at least due to the above-described multi-layered structure, the encapsulation layer 160 may allow the cracks to not be connected between the first inorganic encapsulation layer 161 and the organic encapsulation layer 162 and/or between the organic encapsulation layer 162 and the second inorganic encapsulation layer 163. Accordingly, formation of a path via which external moisture, oxygen, or the like permeates into the OLED may be prevented or minimized.

As shown in FIG. 4, the display apparatus according to some embodiments may include a second light-emitting diode located in a second pixel PX2. As shown in FIG. 4, the second light-emitting diode may be an OLED having the second pixel electrode 312, the opposite electrode 330, and an intermediate layer 320 between the second pixel electrode 312 and the opposite electrode 330 and including a first color emission layer. A second thin-film transistor 220 electrically connected to the second light-emitting diode, in addition to the second light-emitting diode, may be located on the lower substrate 100. As shown in FIG. 4, the second light-emitting diode electrically connected to the second thin-film transistor 220 refers to the second pixel electrode 312 of the second light-emitting diode being electrically connected to the second thin-film transistor 220. A description of the second pixel electrode 312 and the second thin-film transistor 220 is replaced by the above description of the first pixel electrode 311 and the first thin-film transistor 210.

As shown in FIG. 4, the display apparatus according to some embodiments may include a third light-emitting diode located in a third pixel PX3. As shown in FIG. 4, the third light-emitting diode may be an OLED having the third pixel electrode 313, the opposite electrode 330, and an intermediate layer 320 between the third pixel electrode 313 and the opposite electrode 330 and including a first color emission layer. A third thin-film transistor 230 electrically connected to the third light-emitting diode, in addition to the third light-emitting diode, may be located on the lower substrate 100. As shown in FIG. 4, the third light-emitting diode electrically connected to the third thin-film transistor 230 refers to the third pixel electrode 313 of the third light-emitting diode being electrically connected to the third thin-film transistor 230. A description of the third pixel electrode 313 and the third thin-film transistor 230 is replaced by the above description of the first pixel electrode 311 and the first thin-film transistor 210.

The upper substrate 400 may be located above the lower substrate 100 such that the lower surface of the upper substrate 400 faces the lower substrate 100, e.g., an upper surface of the lower substrate 100. The upper substrate 400 may be located such that the first through third pixel electrodes 311, 312, and 313 are between the upper substrate 400 and the lower substrate 100. The upper substrate 400 may include polymer resin. For example, the upper substrate 400 may include polymer resin, such as polyethersulfone, polyacrylate, polyetherimide, polyethylene naphthalate, polyethylene terephthalate, polyphenylene sulfide, polyarylate, polyimide, polycarbonate, and/or cellulose acetate propionate.

The upper substrate 400 may have a multi-layered structure including two layers each including a polymer resin and a barrier layer including an inorganic material (e.g., silicon oxide, silicon nitride, silicon oxynitride, and/or the like) between the two layers. In this way, various modifications may be made. The upper substrate 400 may have flexible or bendable characteristics.

The upper substrate 400 has a first area A1 corresponding to the first pixel electrode 311, a second area A2 corresponding to the second pixel electrode 312, and a third area A3 corresponding to the third pixel electrode 313. The expression "corresponding to" refers to overlapping as viewed in a direction (e.g., the z-axis direction) perpendicular to the upper surface of the upper substrate 400. In other words, as viewed in the direction perpendicular to the upper surface of the upper substrate 400, the first area A1 overlaps the first pixel electrode 311, the second area A2 overlaps the second pixel electrode 312, and the third area A3 overlaps the third pixel electrode 313.

Color filter portions may be located on the lower surface of the upper substrate 400 in a direction (e.g., −z-axis direction) toward the lower substrate 100. The color filter portions may include first through third color filter portions 400a, 400b, and 400c corresponding to the first through third pixels PX1, PX2, and PX3. The first through third color filter portions 400a, 400b, and 400c may overlap the first through third pixel electrodes 311, 312, and 313, as viewed in a direction (e.g., the z-axis direction) perpendicular to the lower substrate 100 or the upper substrate 400. The first through third color filter portions 400a, 400b, and 400c may filter light beams respectively emitted by the first through third light-emitting diodes, respectively. Accordingly, the display apparatus may display a full color image. In some embodiments, the first through third color filter portions 400a, 400b, and 400c may also filter incident light beams from an ambient environment to prevent or reduce light reflection.

According to an embodiment, the first color filter portion 400a may include a light-transmissive layer 415 located between the upper substrate 400 and the opposite electrode 330 and a first color filter layer 410 located between the upper substrate 400 and the light-transmissive layer 415, in the first area A1. The second color filter portion 400b may include a second color quantum dot layer 425 located between the upper substrate 400 and the opposite electrode 330 and a second color filter layer 420 located between the upper substrate 400 and the second color quantum dot layer 425, in the second area A2. The third color filter portion 400c may include a third color quantum dot layer 435 located between the upper substrate 400 and the opposite electrode 330 and a third color filter layer 430 located between the upper substrate 400 and the third color quantum dot layer 435, in the third area A3.

The first color filter layer 410 may transmit only light having a wavelength ranging from about 450 nm to about 495 nm. The first color filter layer 410 may be located on the lower surface of the upper substrate 400 in the direction (e.g., the −z-axis direction) toward the lower substrate 100. The first color filter layer 410 covers the first area A1 corresponding to the first light-emitting diode of the upper substrate 400. As shown in FIG. 4, the first color filter layer 410 has a 1-$2^{nd}$ opening 412 that exposes the second area A2 corresponding to the second pixel electrode 312. The 1-$2^{nd}$ opening 412 may define a region of the second pixel PX2. The first color filter layer 410 also has a 1-$3^{rd}$ opening 413 that exposes the third area A3 corresponding to the third pixel electrode 313. The 1-$3^{rd}$ opening 413 may define a region of the third pixel PX3.

The second color filter layer 420 may transmit only light having a wavelength ranging from about 495 nm to about 570 nm. The second color filter layer 420 may include a portion located on a lower surface of the first color filter layer 410 in a direction (e.g., the −z-axis direction) toward the lower substrate 100, and a portion that fills the 1-$2^{nd}$ opening 412 of the first color filter layer 410. The portion of the second color filter layer 420 located on the lower surface of the first color filter layer 410 in the direction (e.g., the −z-axis direction) toward the lower substrate 100 may serve as a partition wall that does not transmit light. The portion of the second color filter layer 420 that fills the 1-$2^{nd}$ opening 412 of the first color filter layer 410 may be located on the lower surface of the upper substrate 400 in the direction (e.g., the −z-axis direction) toward the lower substrate 100. As shown in FIG. 4, the second color filter layer 420 has a 2-$1^{th}$ opening 421 that exposes the first area A1 corresponding to the first pixel electrode 311. The 2-$1^{th}$ opening 421 may define a region of the first pixel PX1. The second color filter layer 420 also has a 2-$3^{rd}$ opening 423 that exposes the third area A3 corresponding to the third pixel electrode 313.

The third color filter layer 430 may transmit only light having a wavelength ranging from about 630 nm to about 780 nm. The third color filter layer 430 fills the 1-$3^{rd}$ opening 413 of the first color filter layer 410. The third color filter layer 430 may also be understood as filling the 2-$3^{rd}$ opening 423 of the second color filter layer 420.

The first through third color filter layers 410, 420, and 430 may reduce reflection of external light in the display apparatus. For example, when external light reaches the first color filter layer 410, only light with a predetermined wavelength as described above is transmitted by the first color filter layer 410, and light with the other wavelength(s) is absorbed by the first color filter layer 410. Accordingly, only light with a predetermined wavelength (or range of wavelengths) as described above from among external light incident upon the display apparatus is transmitted by the first color filter layer 410, and a portion of the transmitted light is reflected by the opposite electrode 330 or the first pixel electrode 311 below the first color filter layer 410 and is emitted back to the outside. Consequently, only a portion of external light incident upon the first pixel PX1 is reflected toward the outside, thereby reducing reflection of external light. This description is equally applicable to the second color filter layer 420 and the third color filter layer 430.

As seen in FIG. 4, the 2-$1^{th}$ opening 421 of the second color filter layer 420 defines the first area A1, the 1-$2^{nd}$ opening 412 of the first color filter layer 410 defines the second area A2, and the 1-$3^{rd}$ opening 413 of the first color filter layer 410 defines the third area A3. However, embodiments are not limited thereto.

According to another embodiment, as shown in FIG. 5, a black matrix 510 may be between the first through third color filter layers 410, 420, and 430. The black matrix 510 may define the regions of the first through third pixels PX1, PX2, and PX3 by having openings respectively corresponding to the first area through third areas A1, A2, and A3. The black matrix 510 may include the same material as that included in a bank 500, which will be described later. For example, the black matrix 510 may include an inorganic material, such as silicon oxide, silicon nitride, and/or silicon oxynitride. According to some embodiments, the black matrix 510 may include a photoresist material. In this case, the black matrix 510 may be easily formed through processes, such as exposure and development processes.

The bank 500 may be located between an overlapping portion between color filter layers and the lower substrate 100. According to an embodiment, as shown in FIG. 4, the bank 500 may be located between an overlapping portion between the first color filter layer 410 and the second color filter layer 420 and the lower substrate 100. According to some embodiments, when the display apparatus includes the above-described black matrix 510, the bank 500 may be located to be overlapped by the black matrix 510.

The bank 500 may have a first opening 501 corresponding to the first area A1, a second opening 502 corresponding to the second area A2, and a third opening 503 corresponding to the third area A3. The first through third openings 501, 502, and 503 of the bank 500 may correspond to the openings of the pixel definition layer 150 that define the regions of the first through third pixels PX1, PX2, and PX3. When the first through third openings 501, 502, and 503 of the bank 500 correspond to the openings of the pixel definition layer 150 that define the respective regions of the first through third pixels PX1, PX2, and PX3, it means that, as viewed in the direction (e.g., the z-axis direction) perpendicular to the upper surface of the upper substrate 400, the shapes of the respective edges of the first through third openings 501, 502, and 503 of the bank 500 may be the same as or similar to the shapes of the edges of the openings of the pixel definition layer 150 that define the respective regions of the first through third pixels PX1, PX2, and PX3.

The bank 500 may include an inorganic material, such as silicon oxide, silicon nitride, and/or silicon oxynitride. According to some embodiments, the bank 500 may include a photoresist material. In this case, the bank 500 may be easily formed through processes, such as exposure and development processes.

The light-transmissive layer 415 fills a first opening 501 of the bank 500. The first color emission layer included in the intermediate layer 320 on the first pixel electrode 311 may emit light in a first wavelength band, for example, light having a wavelength ranging from about 450 nm to about 495 nm. In the first pixel PX1, the light in the first wavelength band is emitted to the outside through the upper substrate 400, without wavelength conversion. Accordingly, the first pixel PX1 may have no quantum dot layers. At least because a quantum dot layer is not required in the first opening 501 of the bank 500, the light-transmissive layer 415 formed of a light-transmitting resin may be located in the first opening 501. The light-transmissive layer 415 may include acryl, BCB, and/or HMDSO, but embodiments are not limited thereto. According to some embodiments, unlike in FIG. 4, the light-transmissive layer 415 may not be located in the first opening 501 of the bank 500.

The second color quantum dot layer 425 fills a second opening 502 of the bank 500. The second color quantum dot layer 425 may convert the light in the first wavelength band generated by the intermediate layer 320 on the second pixel electrode 312 into light in a second wavelength band. For example, when the light having a wavelength ranging from about 450 nm to about 495 nm is generated by the intermediate layer 320 on the second pixel electrode 312, the second color quantum dot layer 425 may convert the light into light having a wavelength ranging from about 495 nm to about 570 nm. Accordingly, in the second pixel PX2, the light having the wavelength ranging from about 495 nm to about 570 nm may be emitted to the outside through the upper substrate 400.

The third color quantum dot layer 435 fills a third opening 503 of the bank 500. The third color quantum dot layer 435 may convert the light in the first wavelength band generated by the intermediate layer 320 on the third pixel electrode 313 into light in a third wavelength band. For example, when the light having a wavelength ranging from about 450 nm to about 495 nm is generated by the intermediate layer 320 on the third pixel electrode 313, the third color quantum dot layer 435 may convert the light into light having a wavelength ranging from about 630 nm to about 780 nm. Accordingly, in the third pixel PX3, the light having a wavelength ranging from about 630 nm to about 780 nm is emitted to the outside through the upper substrate 400.

Each of the second color quantum dot layer 425 and the third color quantum dot layer 435 may have a shape formed by dispersing quantum dots in a resin. The quantum dots include a semiconductor material, such as cadmium sulfide (CdS), cadmium telluride (CdTe), zinc sulfide (ZnS), and/or indium phosphide (InP), but embodiments are note limited thereto. The quantum dots may have a size of several nanometers, and a wavelength of light after conversion varies according to the size of the quantum dots and/or shell/core structure. Any suitable light-transmissive material may be used as the resin included in the second color quantum dot layer 425 and the third color quantum dot layer 435. For example, a polymer resin, such as acryl, benzocyclobutene (BCB), and/or hexamethyldisiloxane (HMDSO) may be used as materials respectively used to form the second color quantum dot layer 425 and the third color quantum dot layer 435. The materials respectively used to form the second color quantum dot layer 425 and the third color quantum dot layer 435 may be located within the second opening 502 and the third opening 503 of the bank 500, respectively, by inkjet printing.

Although described as including quantum dots, the second and/or third quantum dot layers 425 and 435 may additionally or alternatively include quantum disks, quantum rods, quantum wires core/shell quantum structures, and/or the like.

A first protective layer IL1 may be located between the first color filter layer 410 and the light-transmissive layer 415, between the second color filter layer 420 and the second color quantum dot layer 425, and between the third color filter layer 430 and the third color quantum dot layer 435. A second protective layer IL2 may be arranged to cover lower surfaces of the light-transmissive layer 415, the second color quantum dot layer 425, and the third color quantum dot layer 435 in a direction toward the lower substrate 100. Each of the first protective layer IL1 and the second protective layer IL2 may be integrally formed over the entire surface of the upper substrate 400, but embodiments are not limited thereto. The first protective layer IL1 and the second protective layer IL2 may prevent color filter layers and quantum dot layers from being damaged, during a manufacturing process of the display apparatus or a usage process after the manufacture of the display apparatus.

The first protective layer IL1 and the second protective layer IL2 may include an inorganic insulating material having a light-transmitting property, such as silicon oxide, silicon nitride, and/or silicon oxynitride. The first protective layer IL1 and the second protective layer IL2 may include a layer including at least one material from among polyethylene terephthalate, polyethylene naphthalate, polycarbonate, polyimide, polyethylene sulfonate, polyoxymethylene, polyarylate, and hexamethyldisiloxane, but embodiments are not limited thereto. According to some embodiments, as shown in FIG. 4, the first protective layer IL1 may further include an organic material layer that covers the respective lower surfaces of the first through third color filter layers 410, 420, and 430 in the direction toward the lower substrate 100. In this case, the first protective layer IL1 may have a flat lower surface due to the organic material layer.

Figure 6:
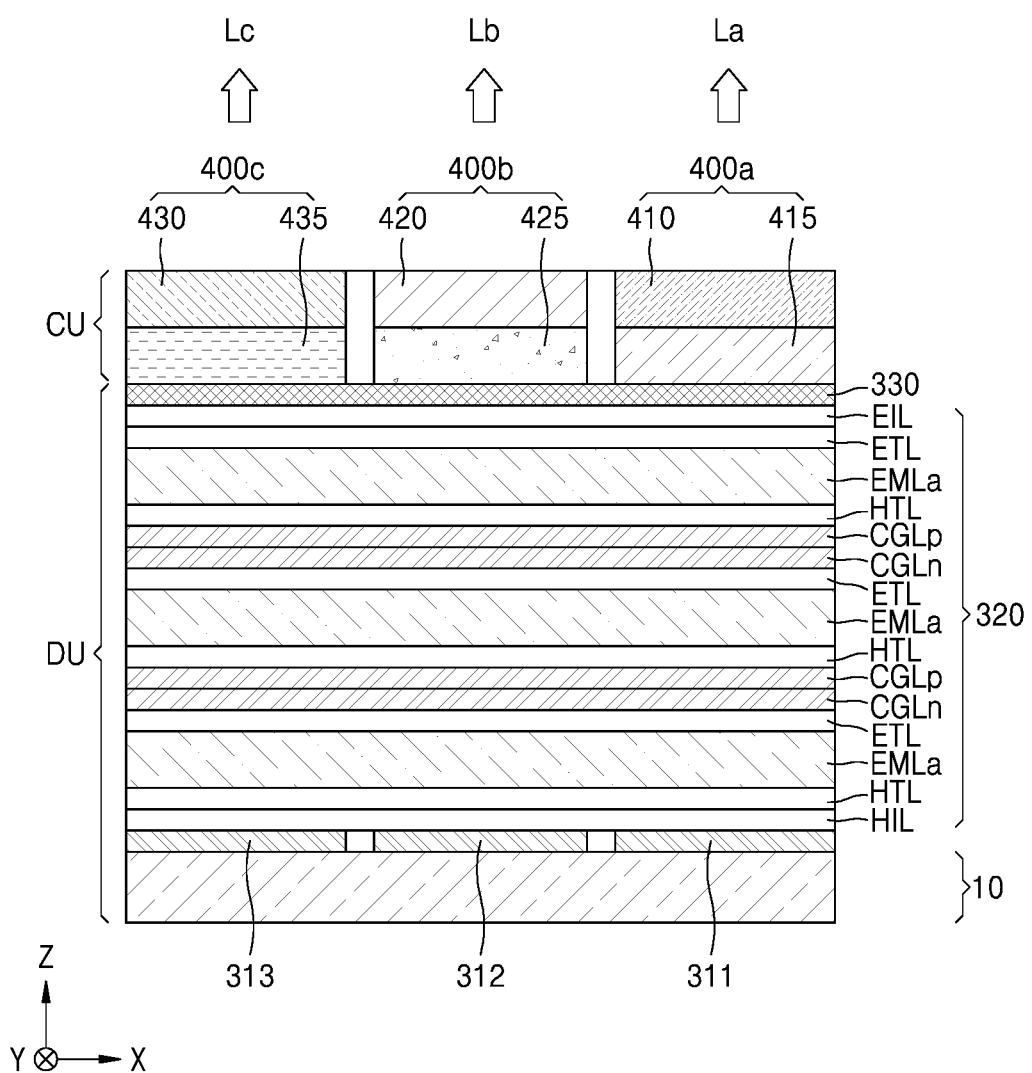
FIG. 6 is a schematic cross-sectional view of a portion of an intermediate layer included in a display apparatus according to an embodiment.
Figure 7:
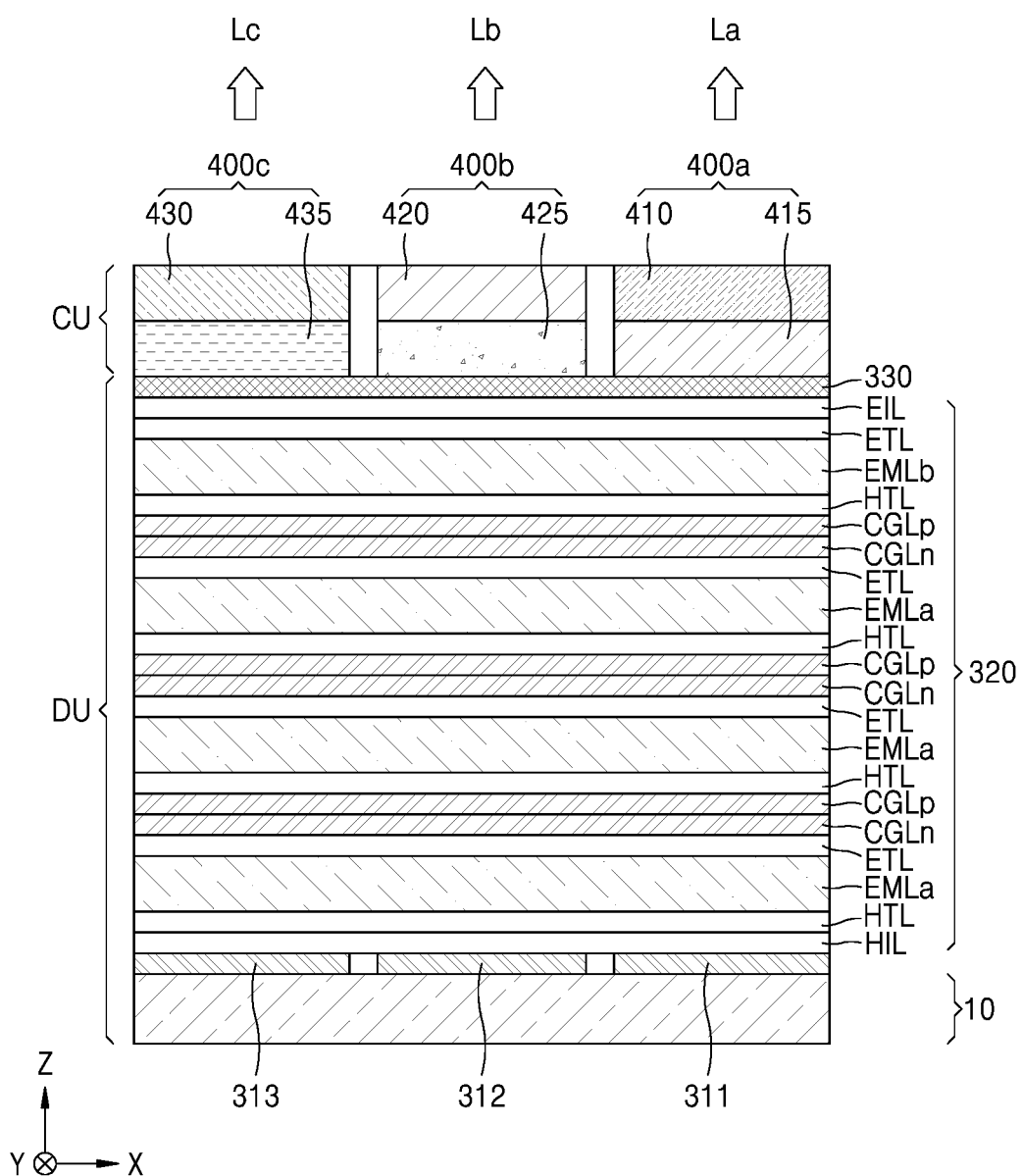
FIG. 7 is a schematic cross-sectional view of a portion of an intermediate layer included in a display apparatus according to an embodiment.

FIG. 6 is a schematic cross-sectional view of a portion of an intermediate layer included in a display apparatus according to an embodiment. FIG. 7 is a schematic cross-sectional view of a portion of an intermediate layer included in a display apparatus according to an embodiment.

Referring to FIGS. 6 and 7, the display apparatus 1 of FIG. 1 may include a thin-film transistor array substrate 10 including the above-described thin-film transistors. First through third light-emitting diodes may be located above the thin-film transistor array substrate 10. The first through third light-emitting diodes may include the first through third pixel electrodes 311, 312, and 313, respectively, the intermediate layer 320, and the opposite electrode 330. The first through third color filter portions 400a, 400b, and 400c corresponding to the first through third pixels PX1, PX2, and PX3, respectively, may be located above the opposite electrode 330.

The intermediate layer 320 included in the first through third light-emitting diodes may have a tandem structure in which a plurality of light-emitting units each including an EML are sequentially stacked. Each of the plurality of light-emitting units refers to a unit including, together with an EML, at least one of an HIL, an HTL, an ETL, and an EIL. For example, a first color light-emitting unit may have a structure in which a hole transport layer HTL, a first color emission layer EMLa, and an electron transport layer ETL are sequentially stacked, and a second color light-emitting unit may have a structure in which a hole transport layer HTL, a second color emission layer EMLb, and an electron transport layer ETL are sequentially stacked.

Light beams emitted by the plurality of EMLs included in the intermediate layer 320 are filtered while passing through the first through third color filter portions 400a, 400b, and 400c located above the opposite electrode 330 and emitted to the outside.

According to an embodiment, as shown in FIG. 6, the intermediate layer 320 may include a plurality of first color light-emitting units each including the first color emission layer EMLa. Although the intermediate layer 320 includes three first color light-emitting units stacked on each other in FIG. 6, the number of first color light-emitting units included in the intermediate layer 320 is not limited to the case of FIG. 6. When the intermediate layer 320 includes a plurality of first color emission layers EMLa as described above, a larger amount of first color light may be emitted from the intermediate layer 320 then when the intermediate layer 320 includes one first color emission layer EMLa, leading to an improvement in luminescent efficiency of the display apparatus.

A charge generation layer (CGL) may be located between the first color light-emitting units. The CGL, which provides electrons or holes, may increase luminescence efficiency of adjacent EMLs. The CGL may include an n-type charge generation layer CGLn that provides electrons, and a p-type charge generation layer CGLp that provides holes. For example, as shown in FIG. 6, the n-type charge generation layer CGLn may be located above the electron transport layer ETL of a light-emitting unit to provide electrons to the electron transport layer ETL, and the p-type charge generation layer CGLp may be located below the hole transport layer HTL of another light-emitting unit to provide holes to the hole transport layer HTL. The CGL may include a metal material.

According to another embodiment, as shown in FIG. 7, the intermediate layer 320 may include one or more first color light-emitting units each including the first color emission layer EMLa, and one or more second color light-emitting units each including a second color emission layer EMLb. Although the intermediate layer 320 includes three first color light-emitting units and one second color light-emitting unit sequentially stacked in FIG. 7, the number of first color light-emitting units included in the intermediate layer 320 and the number of second color light-emitting units included in the intermediate layer 320, and layout of the first and second color light-emitting units are not limited to the case of FIG. 7. For example, in contrast with FIG. 7, a second color light-emitting unit may be located between first color light-emitting units, or a second color light-emitting unit may be located at the bottom and first color light-emitting units may be sequentially stacked above the second color light-emitting unit.

Also, in the embodiment described in association with FIG. 7, the CGL may be located between first color light-emitting units, between second color light-emitting units, and/or between a first color light-emitting unit and a second color light-emitting unit.

When the intermediate layer 320 includes one or more first color emission layers EMLa and one or more second color emission layers EMLb, low luminescence efficiency of the second color emission layer EMLb or low light conversion efficiency of the second color quantum dot layer 425 may be improved, compared to when the intermediate layer 320 includes only the first color emission layer EMLa. Moreover, a difference in luminescence efficiency between EMLs for pixels and a difference in light conversion efficiency of quantum dot layers for pixels may be improved, thereby controlling the area of each pixel. This will be described later with reference to FIGS. 8A through 8D.

FIGS. 8A through 8D are plan views schematically illustrating a layout of pixels included in a display apparatus according to various embodiments. For convenience, in FIGS. 8A through 8D, the areas of pixels are illustrated as respective areas of the light-transmissive layer 415, the second color quantum dot layer 425, and the third color quantum dot layer 435 filling the openings of the bank 500, as elements proportional to the pixels.

As shown in FIGS. 8A through 8D, the display apparatus according to some embodiments may include the bank 500 having openings respectively corresponding to a transmission area TA and respective regions of the first pixel PX1, the second pixel PX2, and the third pixel PX3. A detailed description of the transmission area TA will be given later with reference to FIG. 9.

The light-transmissive layer 415 is located in the opening corresponding to the first pixel PX1 of the bank 500, the second color quantum dot layer 425 is located in the opening corresponding to the second pixel PX2 of the bank 500, and the third color quantum dot layer 435 is located in the opening corresponding to the third pixel PX3 of the bank 500. In this case, the respective areas of the light-transmissive layer 415, the second color quantum dot layer 425, and the third color quantum dot layer 435 may be understood as being proportional to the respective areas of the first pixel PX1, the second pixel PX2, and the third pixel PX3.

Figure 8A:
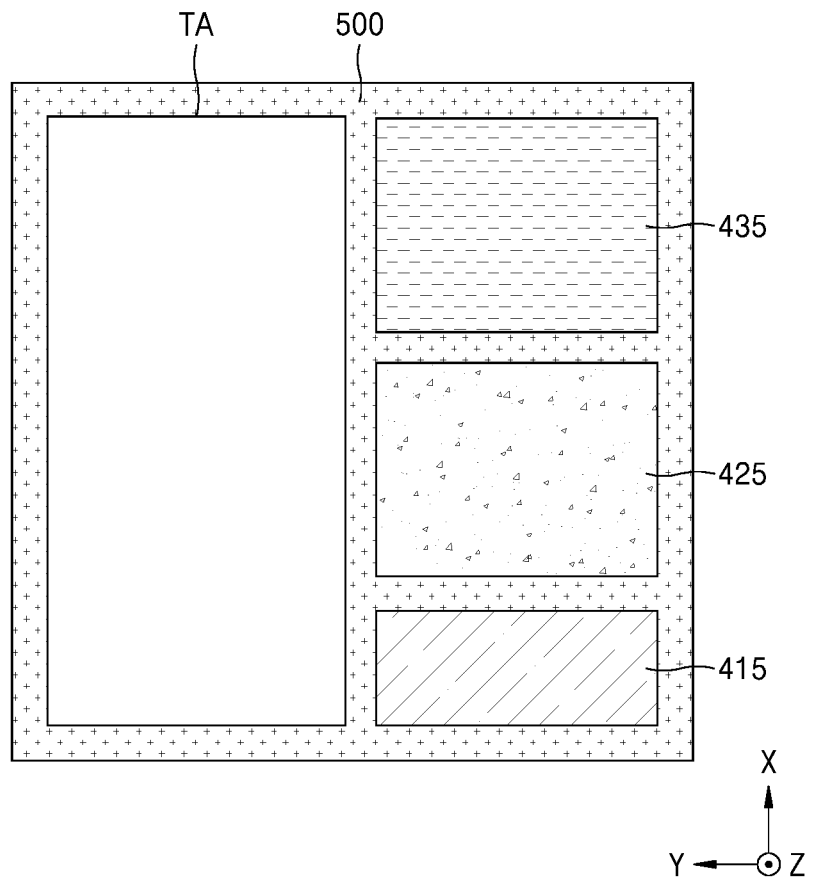
FIGS. 8A, 8B, 8C, and 8D are plan views schematically illustrating a layout of pixels included in a display apparatus according to various embodiments.

FIG. 8A illustrates the areas of the pixels when the intermediate layer 320 includes only the first color emission layer EMLa of FIG. 6. It may be seen from FIG. 8A that a planar area of the light-transmissive layer 415 is less than that of the second color quantum dot layer 425. This may be understood as a planar area of the first pixel PX1 being less than that of the second pixel PX2. This is a layout that takes into account the fact that luminescence efficiency or light conversion efficiency of the second pixel PX2 is less than luminescence efficiency or light conversion efficiency of the first pixel PX1.

Figure 8B:
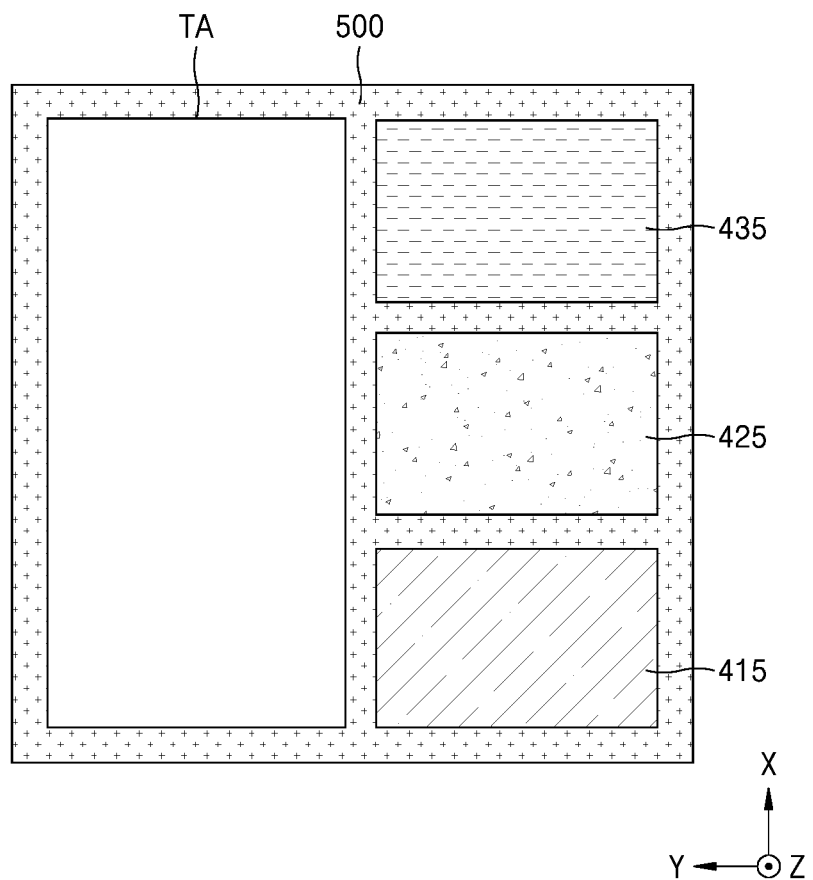
Figure 8C:
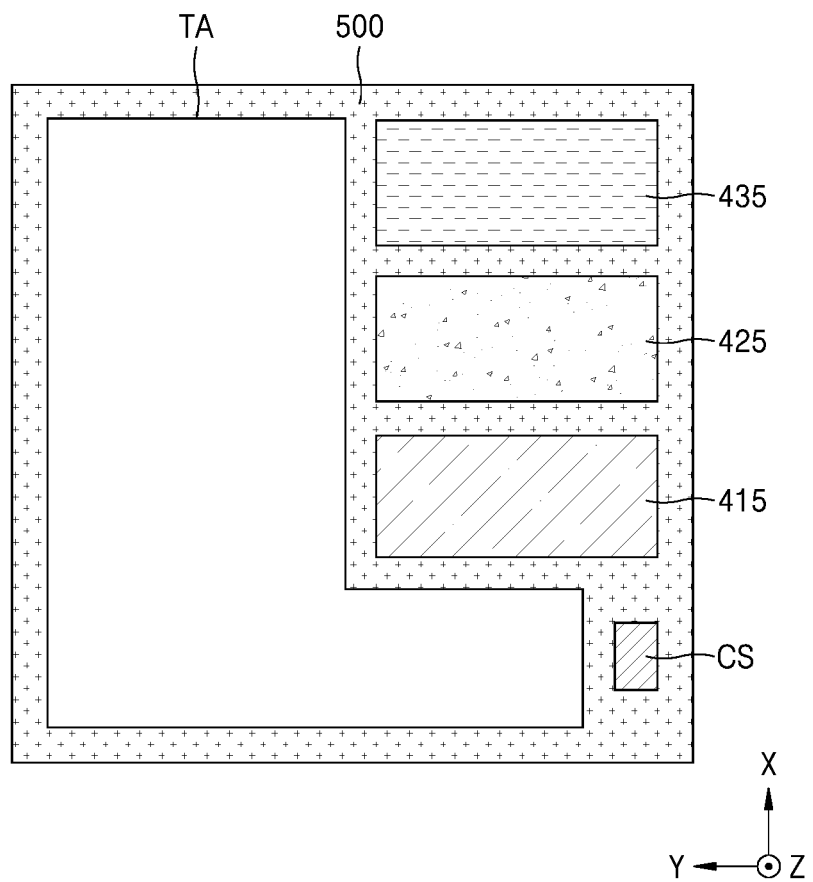
Figure 8D:
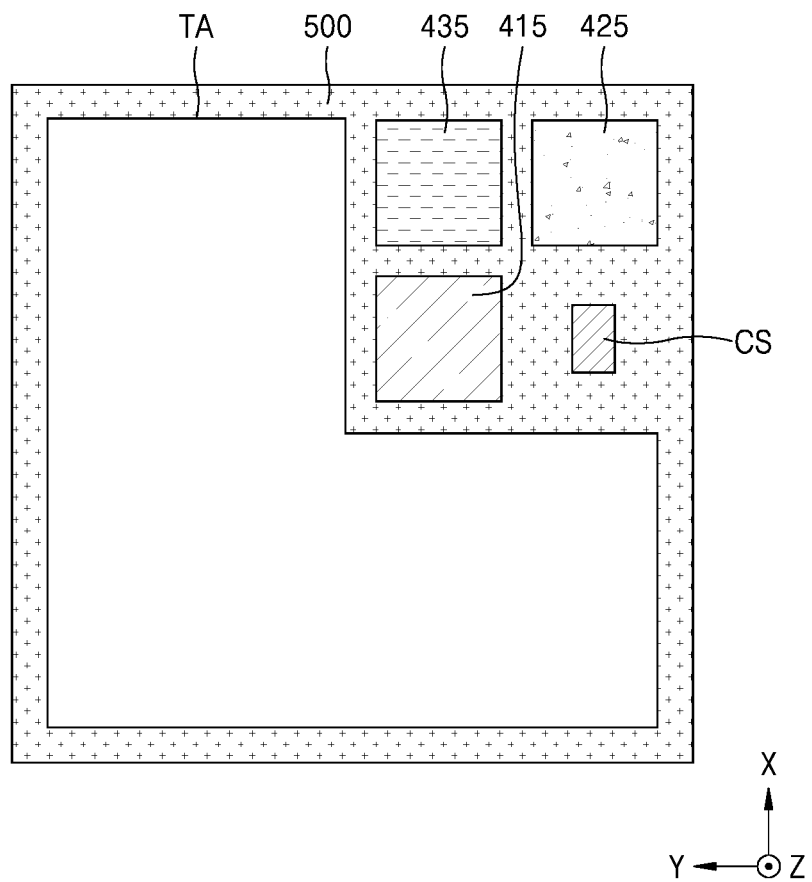

On the other hand, FIGS. 8B through 8D illustrate the areas of pixels when the intermediate layer 320 includes the first color emission layer EMLa and the second color emission layer EMLb. It may be seen from FIGS. 8B through 8D that a planar area of the light-transmissive layer 415 is equal to that of the second color quantum dot layer 425. This may be understood as a planar area of the first pixel PX1 being equal to that of the second pixel PX2. Because the intermediate layer 320 further includes an emission layer of a color having low luminescence efficiency or low light conversion efficiency, the area of a pixel that emits light of the color may be relatively reduced. In other words, the areas of pixels may be controlled by adjusting the emission layers included in the intermediate layer 320.

As shown in FIGS. 8C and 8D, the display apparatus may further include a spacer CS. The spacer CS may maintain and support an interval between the display unit DU of FIG. 2 and the color filter unit CU of FIG. 2 at a certain distance or greater. The spacer CS may have small brittleness and a certain level of elasticity not to be destroyed with an external force. For example, the spacer CS may include a polymer resin, such as silicon resin, an epoxy resin, acryl, BCB, and/or HMDSO, but embodiments are not limited thereto.

As described above with reference to FIGS. 8C and 8D, as the areas of the pixels are controlled, the spacer CS and the transmission area TA may be more efficiently arranged. For example, as shown in FIG. 8C, a wider transmission area TA may be secured as the areas of the pixels having relatively low luminescence efficiency and relatively low light conversion efficiency are reduced. As shown in FIG. 8D, a wider transmission area TA may be secured by adjusting the pixels to have rectangular shapes having the same areas.

Figure 9:
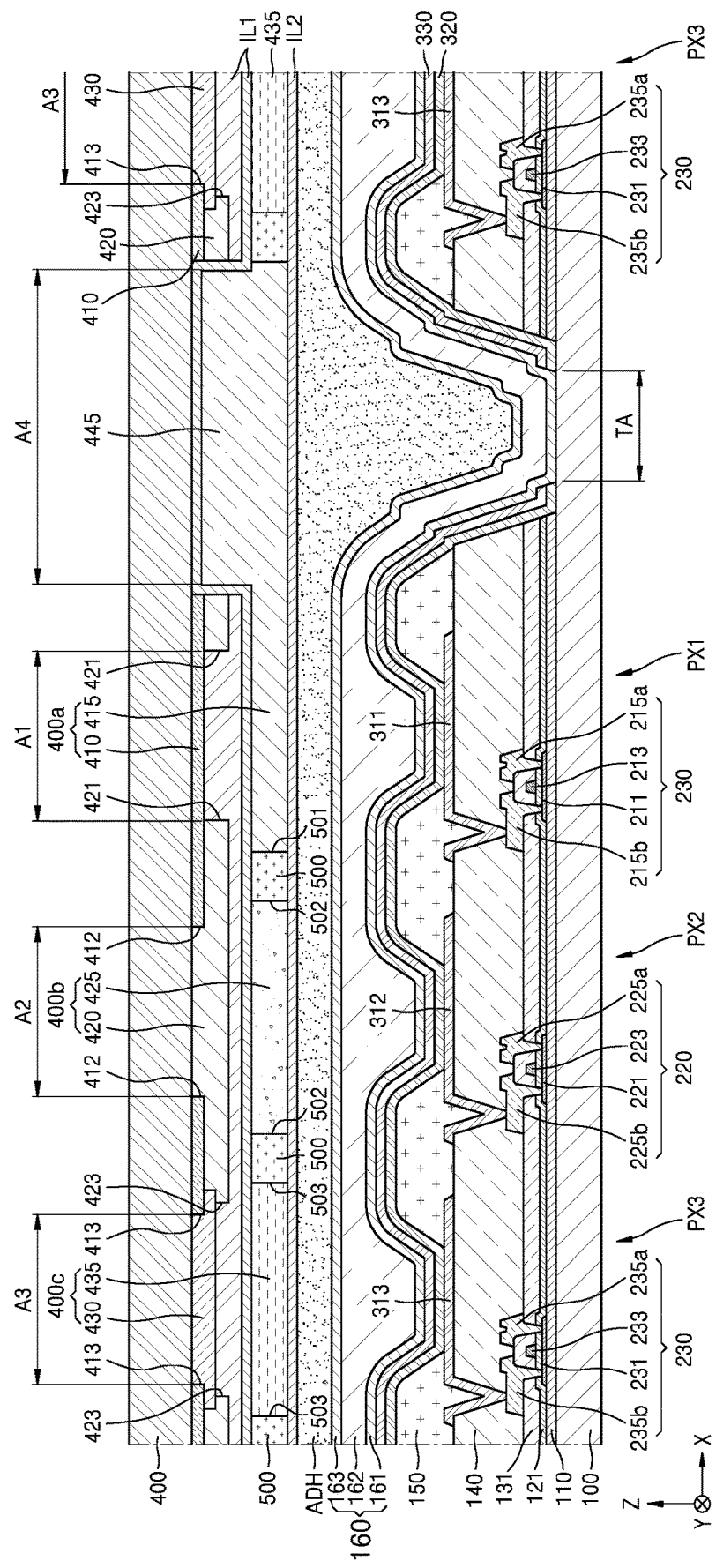
FIG. 9 is a schematic cross-sectional view of a portion of a display apparatus including a transmission area according to an embodiment.
Figure 10:
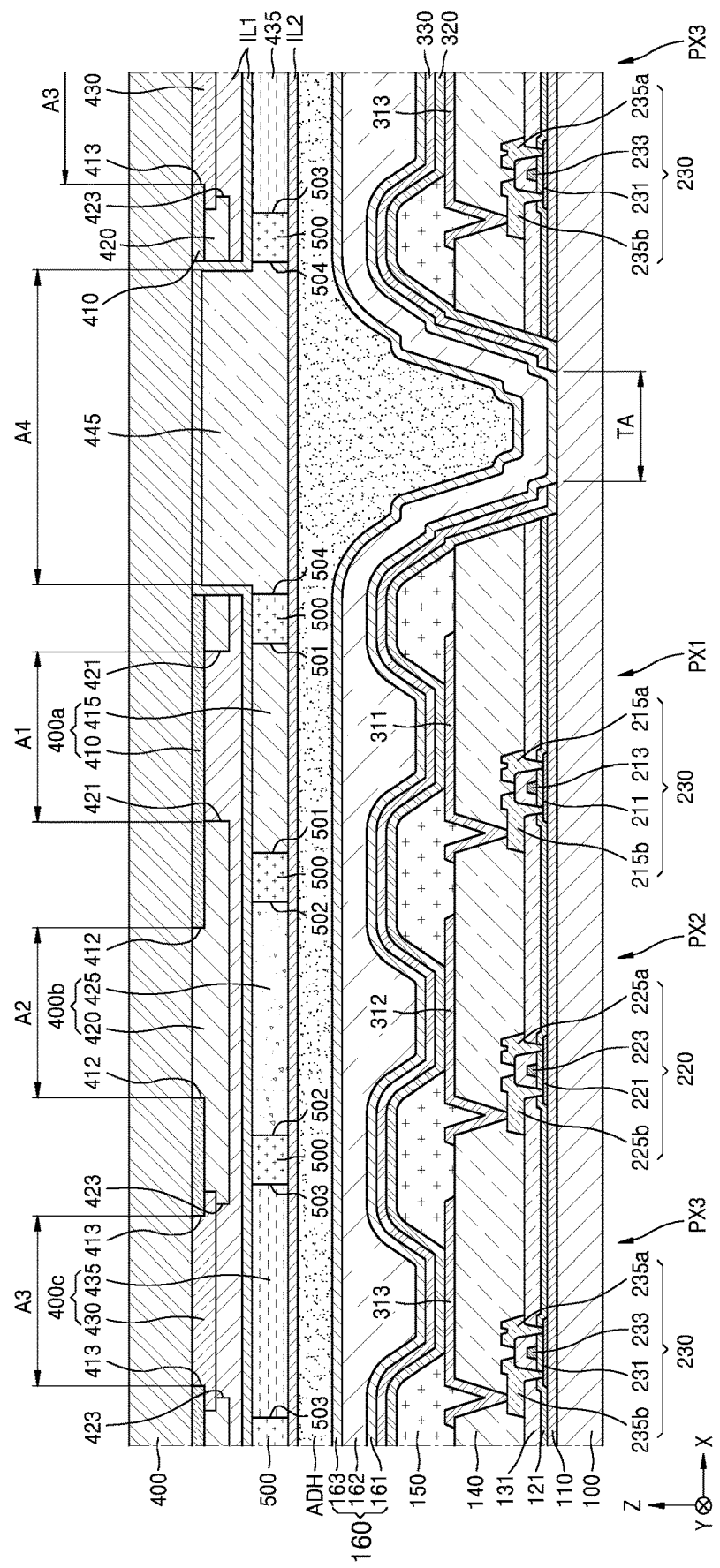
FIG. 10 is a schematic cross-sectional view of a portion of a display apparatus including a transmission area, according to an embodiment.

FIG. 9 is a schematic cross-sectional view of a portion of a display apparatus including a transmission area according to an embodiment. FIG. 10 is a schematic cross-sectional view of a portion of a display apparatus including a transmission area according to an embodiment. Hereinafter, the same reference numerals in the drawings indicate the same components, and repeated descriptions thereof will be omitted.

As shown in FIGS. 9 and 10, each of the display apparatuses may further include a transmission area TA. The transmission area TA may be an area having a relatively high transmittance, compared with the display area DA. The display apparatus may be implemented as a transparent display apparatus by including periodically arranged transmission areas TA. The transparent display apparatus refers to a display apparatus enabling a user to recognize an image displayed due to light emission by the light-emitting diodes of the display apparatus, as well as recognize light beams transmitted by the display apparatus through the transmission area TA. In other words, the transparent display apparatus may be a display apparatus enabling a user to visually recognize a space hidden by (or behind) the display apparatus while displaying an image.

According to an embodiment, no electrodes may be located in the transmission area TA. For example, the intermediate layer 320 and the opposite electrode 330 may have openings corresponding to the transmission area TA. In other words, the intermediate layer 320 and the opposite electrode 330 may be broken up near the edge of the transmission area TA, and thus, may not exist in the transmission area TA. Some or each of the buffer layer 110, the gate insulating layer 121, the interlayer insulating layer 131, the planarization layer 140, and the pixel definition layer 150 located below the intermediate layer 320 may have openings corresponding to the transmission area TA. Thus, the light transmittance in the transmission area TA may improve.

The encapsulation layer 160 may be arranged to cover a groove formed due to the buffer layer 110, the gate insulating layer 121, the interlayer insulating layer 131, the planarization layer 140, the pixel definition layer 150, the intermediate layer 320, and the opposite electrode 330 having openings corresponding to the transmission area TA. The groove may be filled with an epoxy resin or an adhesive layer ADH, but embodiments are not limited thereto.

The upper substrate 400 may include a fourth area A4 corresponding to the transmission area TA. A light-transmissive material layer 445 may be located between the upper substrate 400 and the lower substrate 100, in the fourth area A4. For instance, the light-transmissive material layer 445 may be between the first protective layer IL1 and the second protective layer IL2. The light-transmissive material layer 445 may include a material having a high light transmittance.

The light-transmissive material layer 445 may be formed simultaneously with the light-transmissive layer 415. For example, a space where the light-transmissive material layer 445 is located and a space where the light-transmissive layer 415 is located may be connected to each other and integrated with each other. In other words, the bank 500 may not have openings respectively corresponding to the first area A1 and the transmission area TA, but may have an opening corresponding to both the first area A1 and the transmission area TA. The opening corresponding to both the first area A1 and the transmission area TA of the bank 500 may be filled with a material included in the light-transmissive layer 415. Accordingly, the light-transmissive material layer 445 may include the same material as the material included in the light-transmissive layer 415. The light-transmissive material layer 445 may be formed simultaneously with forming of the light-transmissive layer 415.

The display apparatus described in association with FIG. 10 is different from the display apparatus described in association with FIG. 9 in that the light-transmissive material layer 445 is not integrated with the light-transmissive layer 415 and is located in an independent space.

As shown in FIG. 10, the bank 500 may have the openings respectively corresponding to the first area A1 and the transmission area TA. For example, the bank 500 may have a first opening 501 corresponding to the first area A1 and a fourth opening 504 corresponding to the fourth area A4. The first opening 501 of the bank 500 may be filled with the light-transmissive layer 415, and the fourth opening 504 of the bank 500 may be filled with the light-transmissive material layer 445.

According to an embodiment, the light-transmissive material layer 445 with which the fourth opening 504 of the bank 500 is filled may include the same material as the material included in the light-transmissive layer 415 with which the first opening 501 of the bank 500 is filled. According to another embodiment, the light-transmissive material layer 445 with which the fourth opening 504 of the bank 500 is filled may include a different material from the material included in the light-transmissive layer 415 with which the first opening 501 of the bank 500 is filled. For example, the light-transmissive material layer 445 with which the fourth opening 504 of the bank 500 may include a filler or a transparent resin.

Figure 11:
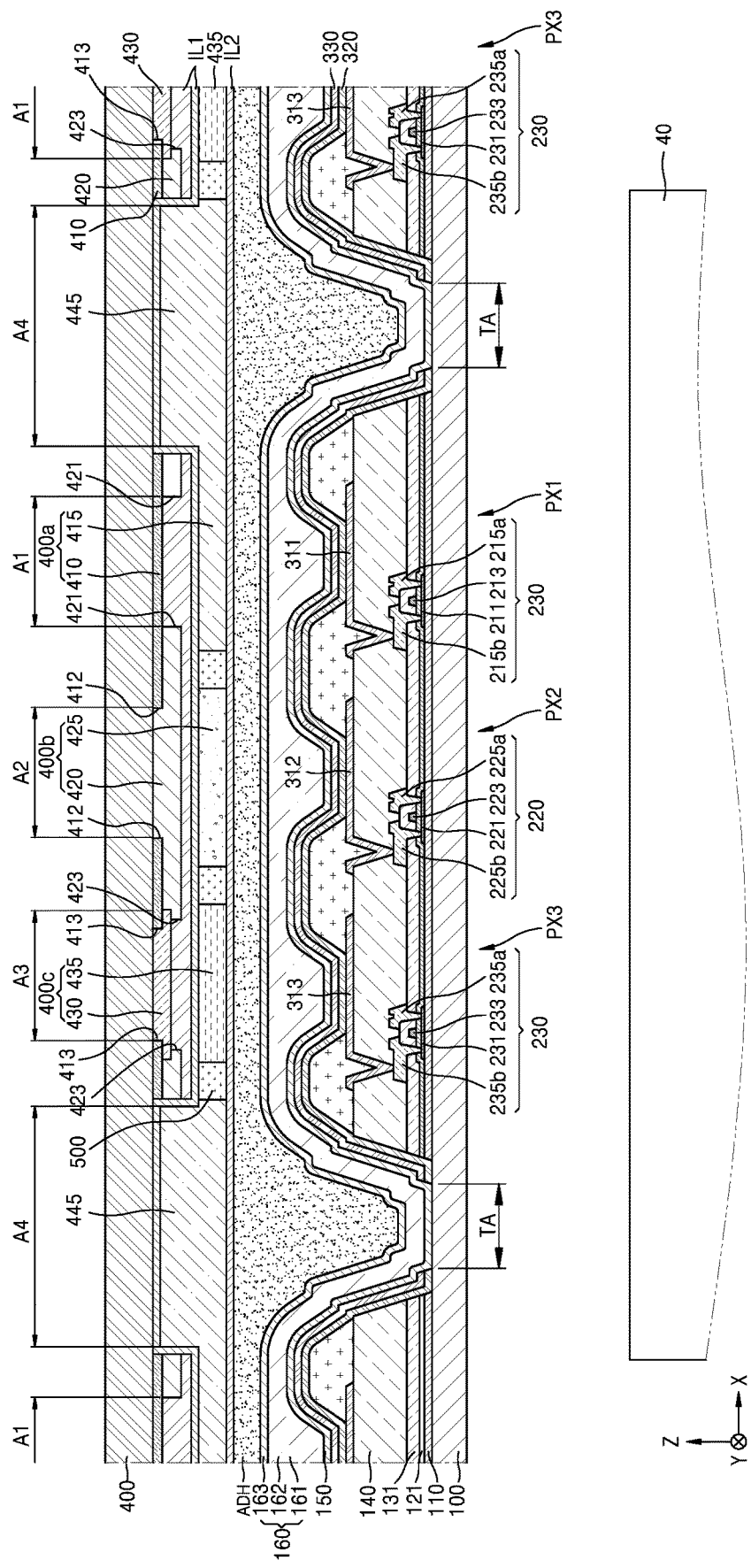
FIG. 11 is a schematic cross-sectional view of a portion of a display apparatus below which a component is located according to an embodiment.

FIG. 11 is a schematic cross-sectional view of a portion of a display apparatus below which a component is located according to an embodiment. For reference, FIG. 11 illustrates that a component 40 is located below the display apparatus described in association with FIG. 9, but the component 40 may be located below the display apparatus described in association with FIG. 10.

The component 40 may be located below each of the display apparatuses described above with reference to FIGS. 9 and 10. In this case, the transmission area TA of the display apparatuses may be provided as an area capable of transmitting light and/or sound of the component 40.

The component 40 may be an electronic device located below the display apparatus to overlap the transmission areas TA. According to an embodiment, the component 40 may be an electronic device that uses light and/or sound. For example, the component 40 may be at least one of a sensor that measures a distance, such as a proximity sensor, or a sensor that recognizes a part of the body of a user, such as a fingerprint, an iris, or a face. The component 40 may also be a small lamp that outputs light, or an image sensor that captures an image, such as a camera.

When the component 40 is an electronic device using light, the component 40 may use light in various wavelength bands, such as visible light, infrared light, and ultraviolet light. The component 40 may be an electronic device using ultrasonic waves or sound of other frequency bands. According to an embodiment, the component 40 include sub-components, like a light emitter and a light receiver. The light emitter and the light receiver may be integrated with each other, or may be physically separated from each other such that a pair of a light emitter and a light receiver may constitute one component 40. To prevent restrictions on the function of the component 40, the display apparatus may include a transmission area TA capable of transmitting light or/and sound that is output from the component 40 to the outside or travels from the outside toward the component 40.

Figure 12:
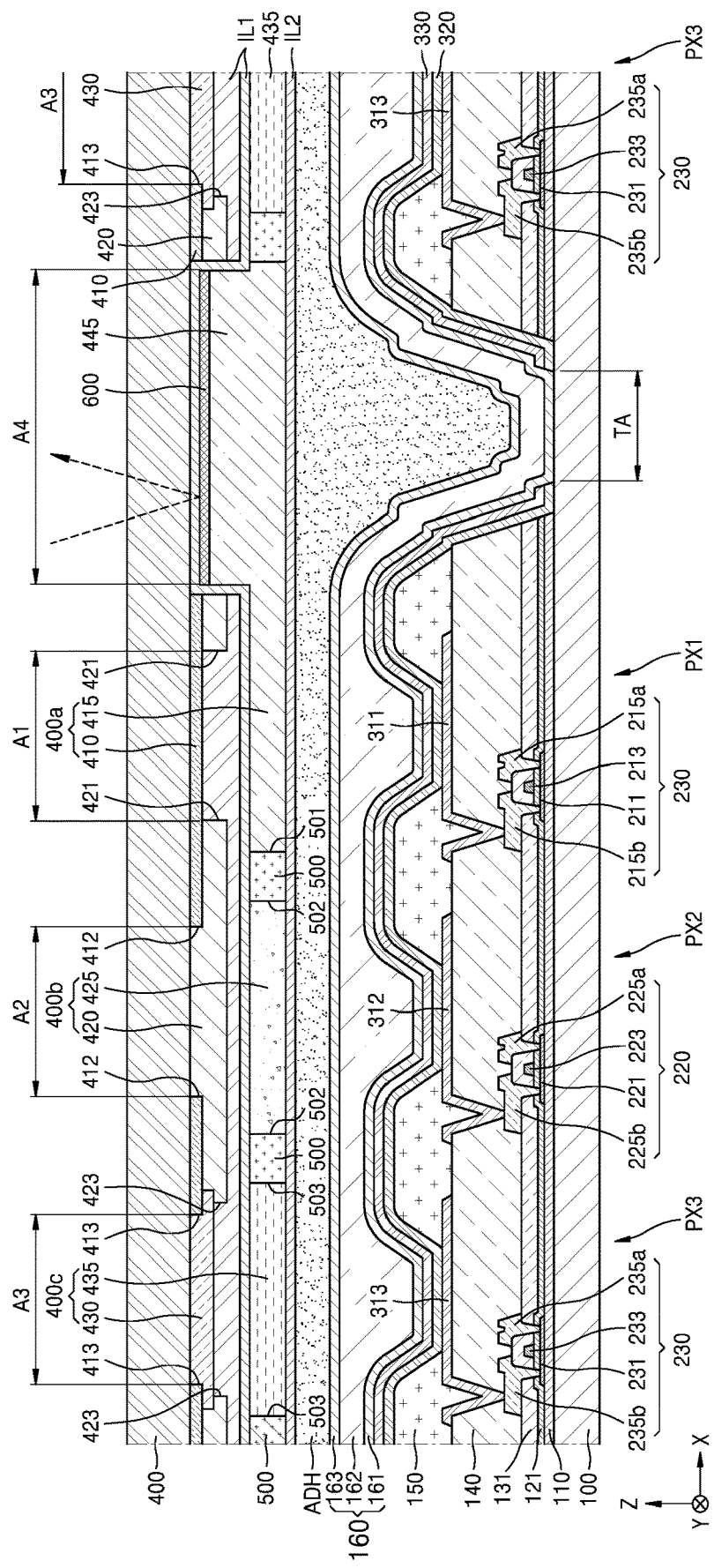
FIG. 12 is a schematic cross-sectional view of a portion of a display apparatus including a first reflective layer according to an embodiment.

FIG. 12 is a schematic cross-sectional view of a portion of a display apparatus including a first reflective layer 600 according to an embodiment. For reference, FIG. 12 illustrates that the display apparatus described with reference to FIG. 9 further includes the first reflective layer 600, but the display apparatus described with reference to FIG. 10 may further include the first reflective layer 600.

As shown in FIG. 12, the display apparatus according to an embodiment may further include the first reflective layer 600. The display apparatus may be implemented as a mirror display apparatus by including periodically arranged transmission areas TA and first reflective layers 600 located in the transmission areas TA. The mirror display apparatus refers to a display apparatus enabling a user to recognize an image displayed according to light emitted by the light-emitting diodes of the display apparatus when the light-emitting diodes operate, and to recognize light reflected by the first reflective layer 600 when the light-emitting diodes of the display apparatus do not operate. In other words, the mirror display apparatus may be a display apparatus of which a front surface may be recognized as a mirror when the light-emitting diodes of the display apparatus do not operate.

The first reflective layer 600 may reflect light introduced from the front surface of the display apparatus, e.g., from above the upper substrate 400. For example, as shown in FIG. 12, light that has entered through the upper surface of the upper substrate 400 from above the upper substrate 400 may be reflected by the first reflective layer 600 toward above the upper substrate 400. The light reflected by the first reflective layer 600 may have a relatively smaller amount of light and a weaker light intensity than the light emitted by the light-emitting diodes of the display apparatus. Accordingly, a user may recognize the light reflected by the first reflective layer 600 with the naked eyes only when the light-emitting diodes of the display apparatus do not operate, and the image displayed by the display apparatus may not be hindered by the light reflected by the first reflective layer 600 when the light-emitting diodes of the display apparatus operate.

The first reflective layer 600 may be between the upper substrate 400 and the lower substrate 100, in the fourth area A4 corresponding to the transmission area TA. For example, the first reflective layer 600 may be between the upper substrate 400 and the light-transmissive material layer 445, in the fourth area A4. The first reflective layer 600 may be located on a lower surface of the first protective layer IL1 in a direction toward the lower substrate 100 in the fourth area A4, and the light-transmissive material layer 445 may cover the lower surface of the first protective layer IL1 in the direction toward the lower substrate 100. The first reflective layer 600 may include a metal material having a high reflectance, such as Ag.

Figure 13:
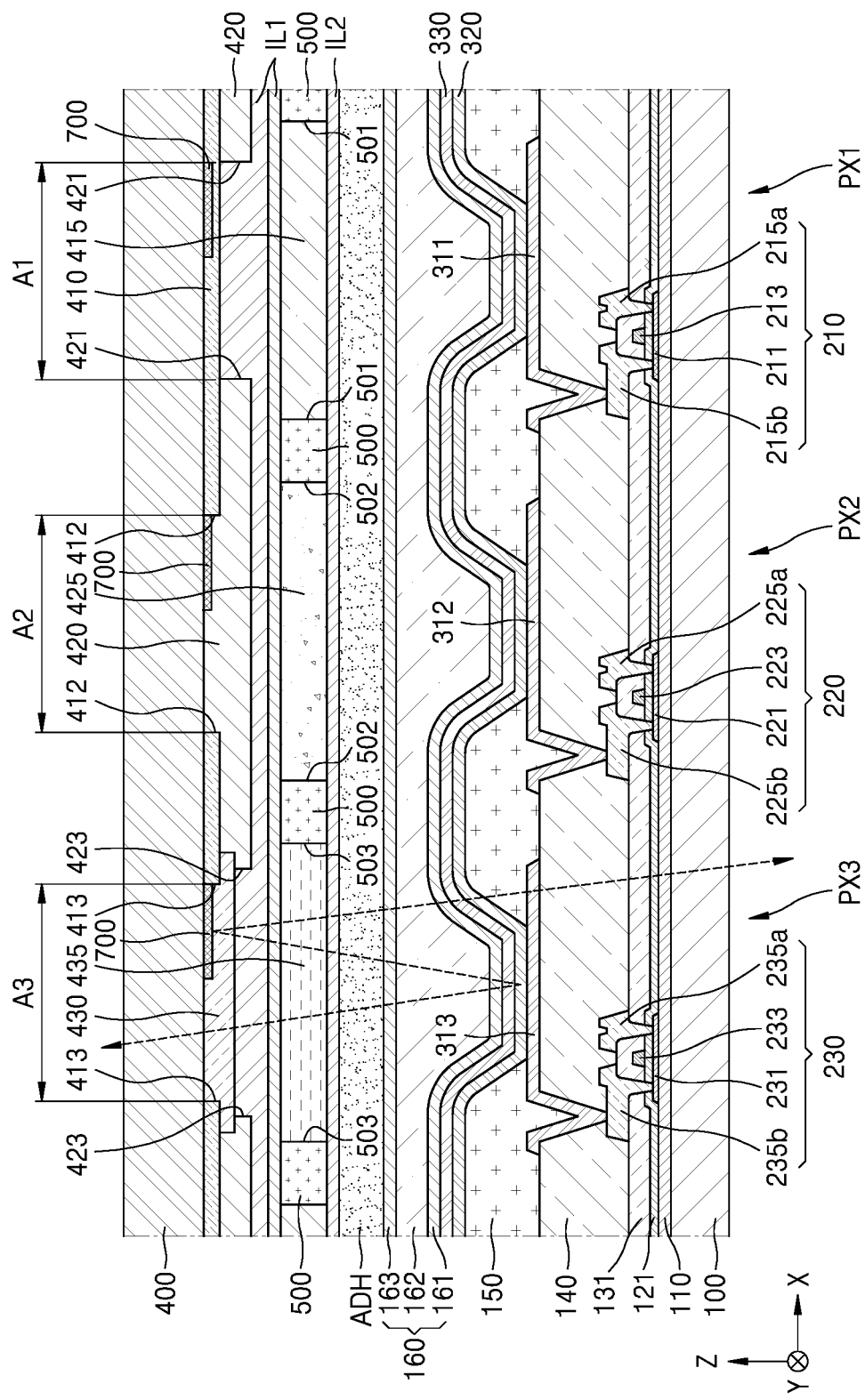
FIG. 13 is a schematic cross-sectional view of a portion of a display apparatus including a second reflective layer according to an embodiment.
Figure 14:
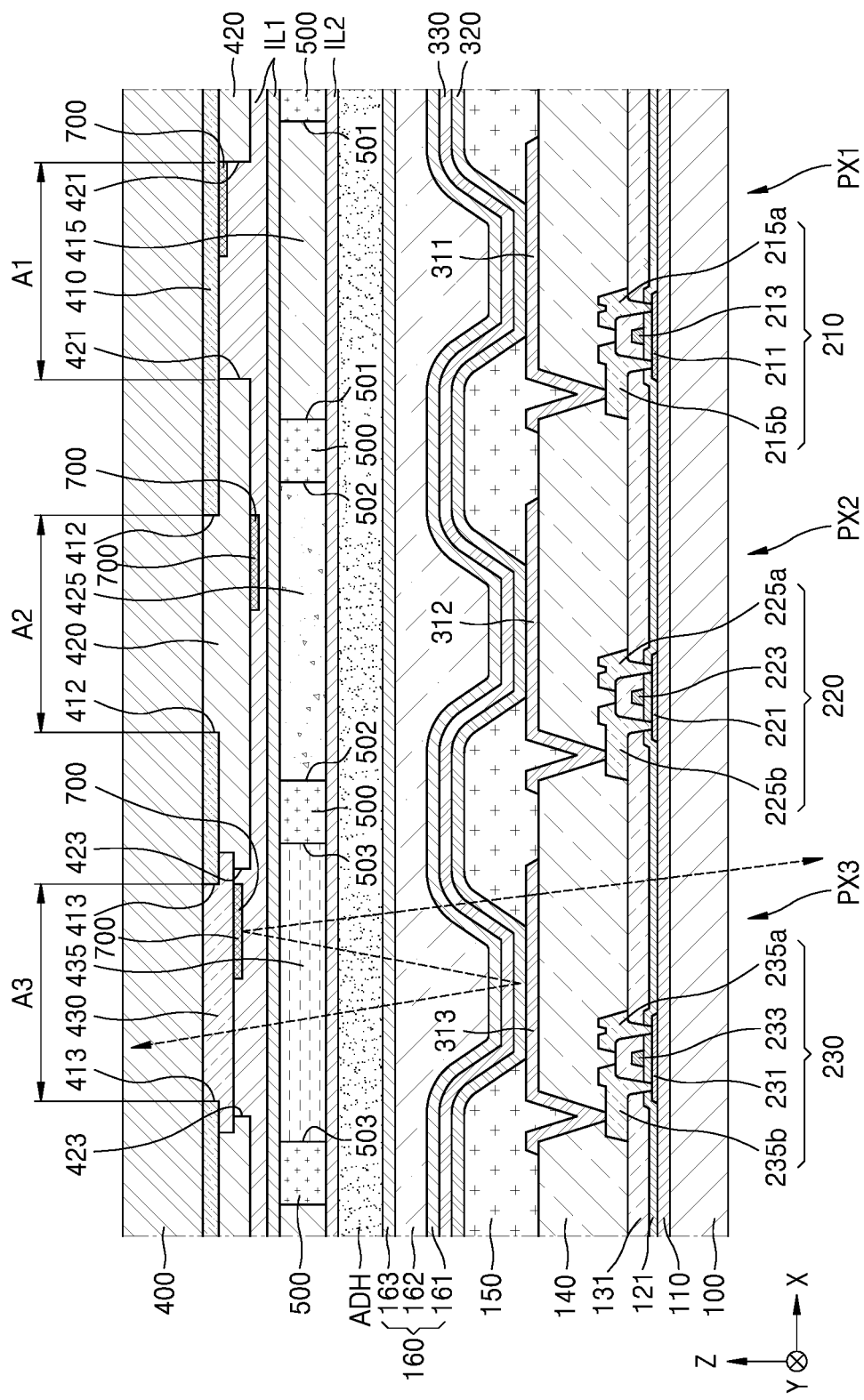
FIG. 14 is a schematic cross-sectional view of a portion of a display apparatus including a second reflective layer according to an embodiment.
Figure 15:
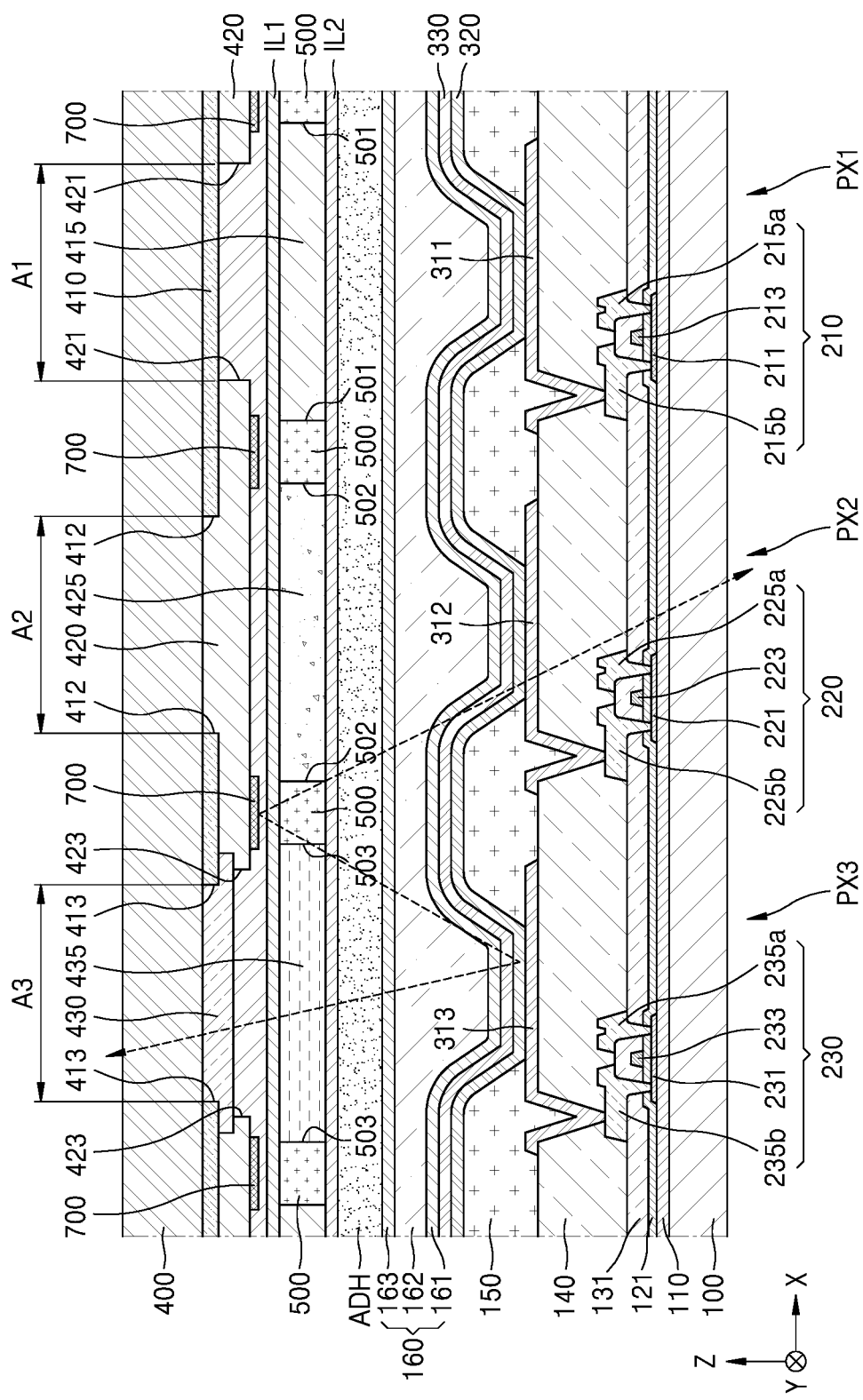
FIG. 15 is a schematic cross-sectional view of a portion of a display apparatus including a second reflective layer according to an embodiment.
Figure 16:
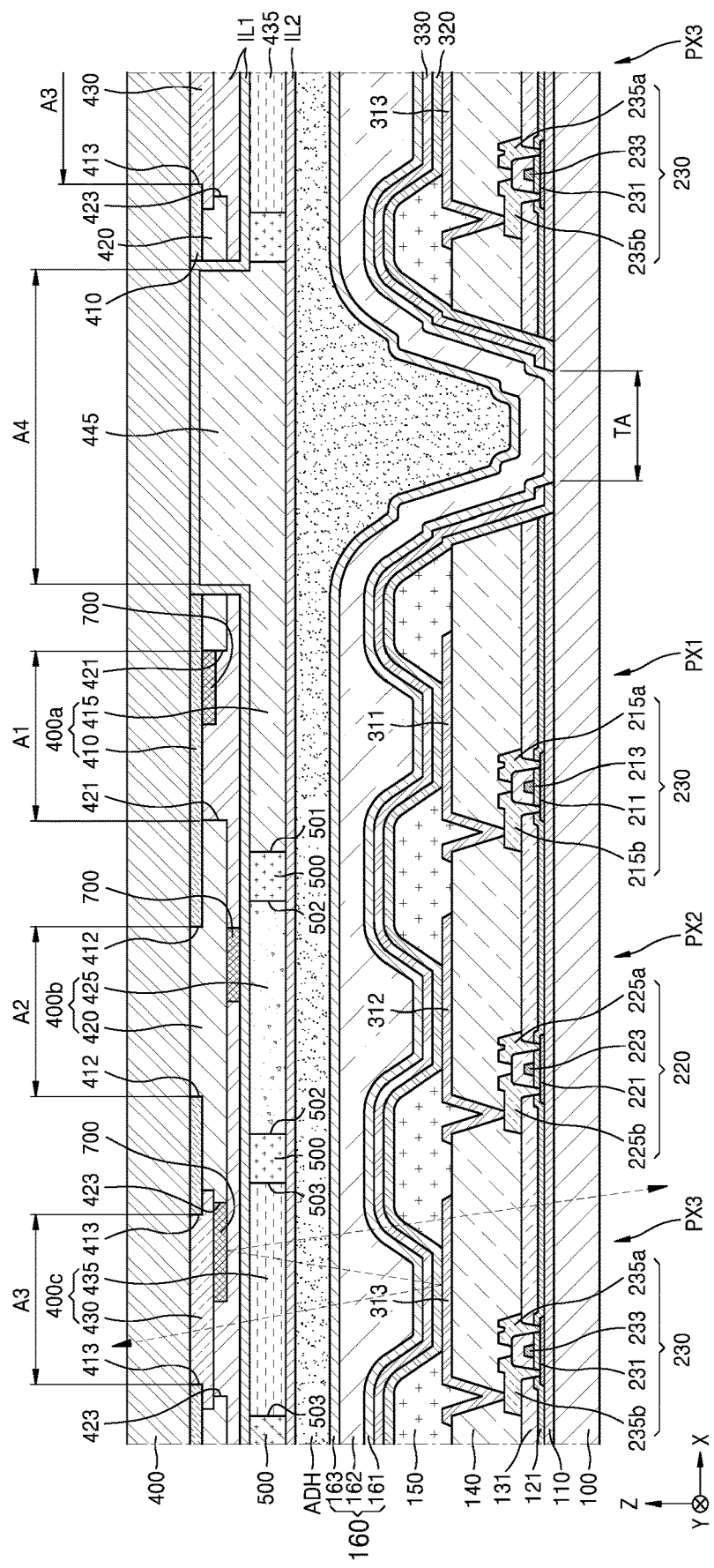
FIG. 16 is a schematic cross-sectional view of a portion of a display apparatus including a second reflective layer according to an embodiment.

FIG. 13 is a schematic cross-sectional view of a portion of a display apparatus including second reflective layers 700 according to an embodiment. FIG. 14 is a schematic cross-sectional view of a portion of a display apparatus including second reflective layers 700 according to an embodiment. FIG. 15 is a schematic cross-sectional view of a portion of a display apparatus including second reflective layers 700 according to an embodiment. FIG. 16 is a schematic cross-sectional view of a portion of a display apparatus including second reflective layers 700 according to an embodiment.

As shown in FIGS. 13 through 16, a display apparatus according to various embodiments may further include second reflective layers 700. The display apparatus may be implemented as a double-sided display apparatus by including the second reflective layers 700. The double-sided display apparatus refers to a display apparatus in which a portion of light emitted by the light-emitting diodes of the display apparatus is emitted toward a front surface of the display apparatus and the remaining portion of the light is reflected by the second reflective layer 700 and emitted toward a rear surface of the display apparatus. In other words, the double-sided display apparatus may be a display apparatus that displays an image on both the front surface and the rear surface thereof.

The second reflective layers 700 may reflect a portion of light emitted by the light-emitting diodes toward the lower substrate 100. For example, as shown in FIG. 13, a portion of light emitted by the light-emitting diodes of the display apparatus may be emitted to the outside of the upper substrate 400 through an area where a second reflective layer 700 is not located, and the remaining portion of light may be reflected by the second reflective layer 700 toward the lower substrate 100 and emitted to the outside of the lower substrate 100.

The second reflective layers 700 are located to overlap at least a portion of the first area A1, at least a portion of the second area A2, and at least a portion of the third area A3. In other words, the light emitted by the light-emitting diodes passes through the upper substrate 400 and is emitted to the outside of the upper substrate 400 in areas not overlapped by the second reflective layers 700, and is reflected by the second reflective layers 700 toward the lower substrate 100 in areas overlapped by the second reflective layers 700.

The second reflective layer 700 may include a metal material having a high reflectance, such as Ag. To improve the quality of an image displayed on the rear surface of the display apparatus, the first through third pixel electrodes 311, 312, and 313 may include a transparent electrode material. According to some embodiments, no thin-film transistors may be located in the path of the light reflected by the second reflective layers 700.

According to an embodiment, as shown in FIG. 13, a second reflective layer 700 may be located on the lower surface of the upper substrate 400 in a direction toward the lower substrate 100 in the first area A1, and the first color filter layer 410 may cover the lower surface of the second reflective layer 700 in the direction toward the lower substrate 100. Another second reflective layer 700 may be located on the lower surface of the upper substrate 400 in the direction toward the lower substrate 100 in the second area A2, and the second color filter layer 420 may cover the lower surface of the second reflective layer 700 in the direction toward the lower substrate 100. Another second reflective layer 700 may be located on the lower surface of the upper substrate 400 in the direction toward the lower substrate 100 in the third area A3, and the third color filter layer 430 may cover the lower surface of the second reflective layer 700 in the direction toward the lower substrate 100. In other words, the second reflective layers 700 may be located between the upper substrate 400 and the first color filter layer 410 in the first area A1, between the upper substrate 400 and the second color filter layer 420 in the second area A2, and between the upper substrate 400 and the third color filter layer 430 in the third area A3, respectively.

According to another embodiment, as shown in FIG. 14, the second reflective layers 700 may be located on the lower surface of the first color filter layer 410 in the direction toward the lower substrate 100 in the first area A1, on the lower surface of the second color filter layer 420 in the direction toward the lower substrate 100 in the second area A2, and on the lower surface of the third color filter layer 430 in the direction toward the lower substrate 100 in the third area A3, respectively. In other words, the second reflective layers 700 may be located between the first color filter layer 410 and the first protective layer IL1 in the first area A1, between the second color filter layer 420 and the first protective layer IL1 in the second area A2, and between the third color filter layer 430 and the first protective layer IL1 in the third area A3, respectively.

According to another embodiment, as shown in FIG. 15, the second reflective layers 700 may be located on the lower surface of the second color filter layer 420 in the direction toward the lower substrate 100, at overlapping portions between the first color filter layer 410 and the second color filter layer 420, respectively. In other words, the second reflective layers 700 may be located on the lower surface of the second color filter layer 420 in the direction toward the lower substrate 100, between the first area A1 and the second area A2, between the second area A2 and the third area A3, and between the third area A3 and the first area A1, respectively.

FIG. 16 illustrates a case where a display apparatus including transmission areas TA further includes the second reflective layers 700 described above with reference to FIG. 14. In this case, the display apparatus may perform a function of the above-described transparent display apparatus and a function of the above-described double-sided display apparatus at the same time. For instance, the display apparatus according to some embodiments may be a display apparatus capable of performing a function as a double-sided display apparatus that displays an image on both its front and rear surfaces, and a function as a transparent display apparatus capable of simultaneously recognizing an image displayed due to light emission by the light-emitting diodes of the display apparatus and light beams transmitted by the display apparatus through the transmission areas TA.

Although FIG. 12 illustrates that the display apparatus described with reference to FIG. 9 further includes the second reflective layers 700, the display apparatus of FIG. 10 may further include the second reflective layers 700. Although FIG. 16 illustrates a case where the display apparatus includes the second reflective layers 700 described above with reference to FIG. 14, the display apparatus may include the second reflective layers 700 described above with reference to FIG. 13 or the second reflective layers 700 described above with reference to FIG. 15.

Figure 17:
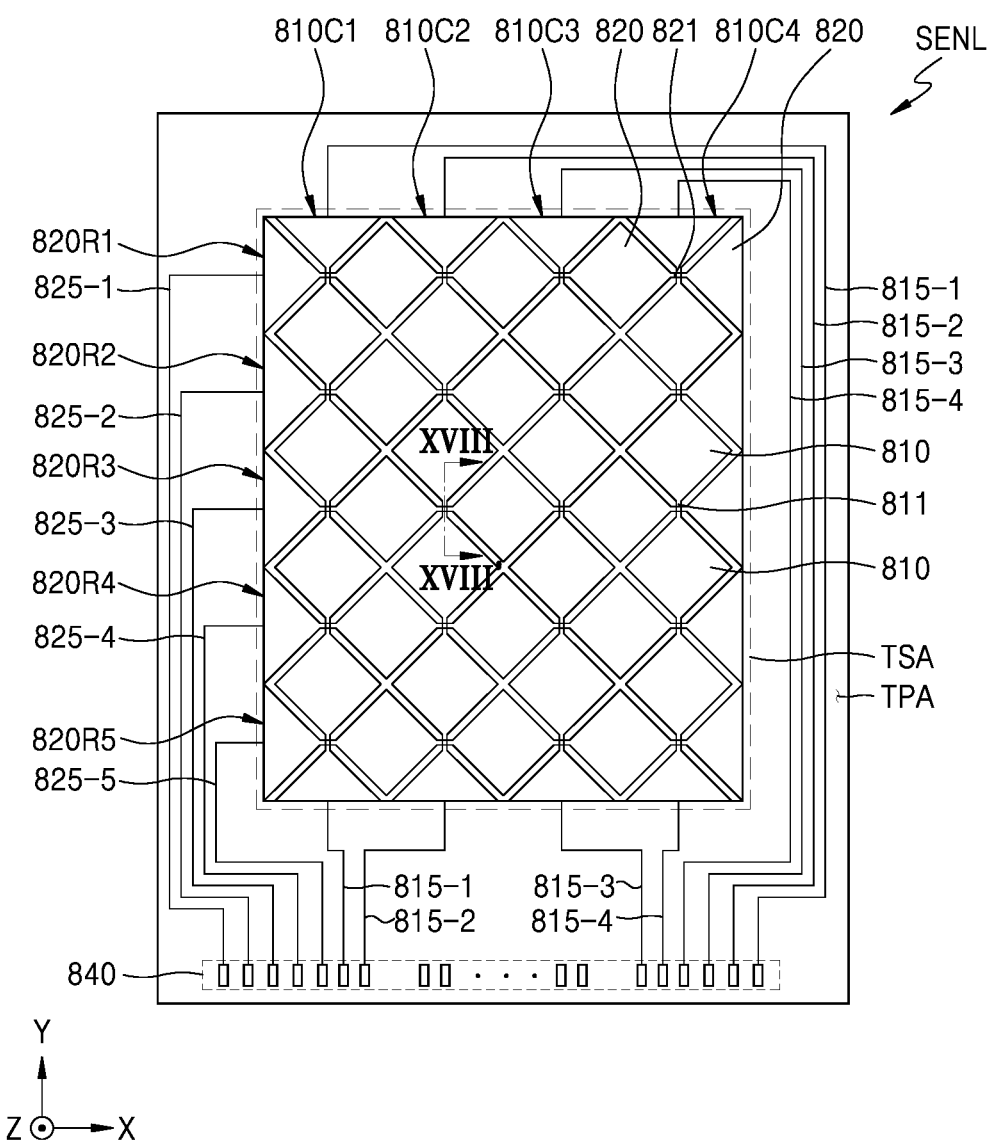
FIG. 17 is a schematic plan view of a portion of a sensor electrode layer included in a display apparatus according to an embodiment.
Figure 18:
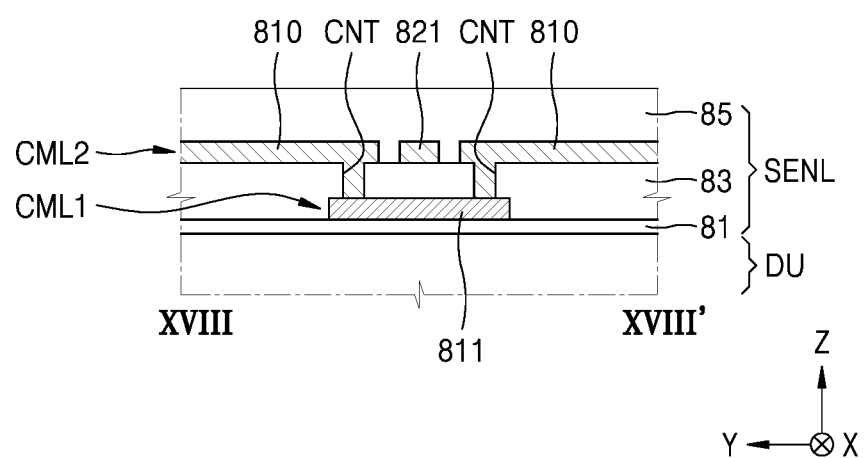
FIG. 18 is a cross-sectional view of a portion of a display apparatus taken along sectional line VIII-VIII' of FIG. 17 according to an embodiment.
Figure 19:
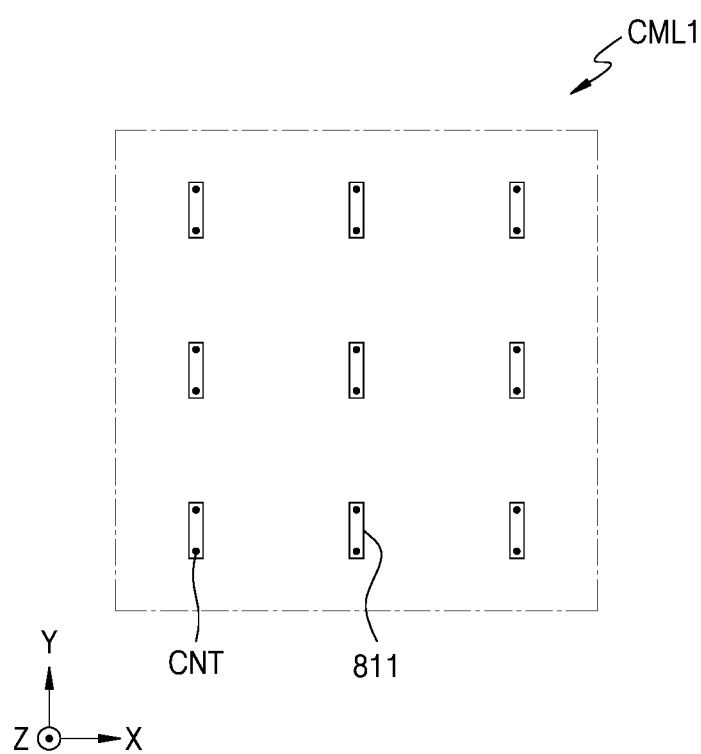
FIG. 19 is a schematic plan view of a portion of a first conductive layer of FIG. 18 according to an embodiment.
Figure 20:
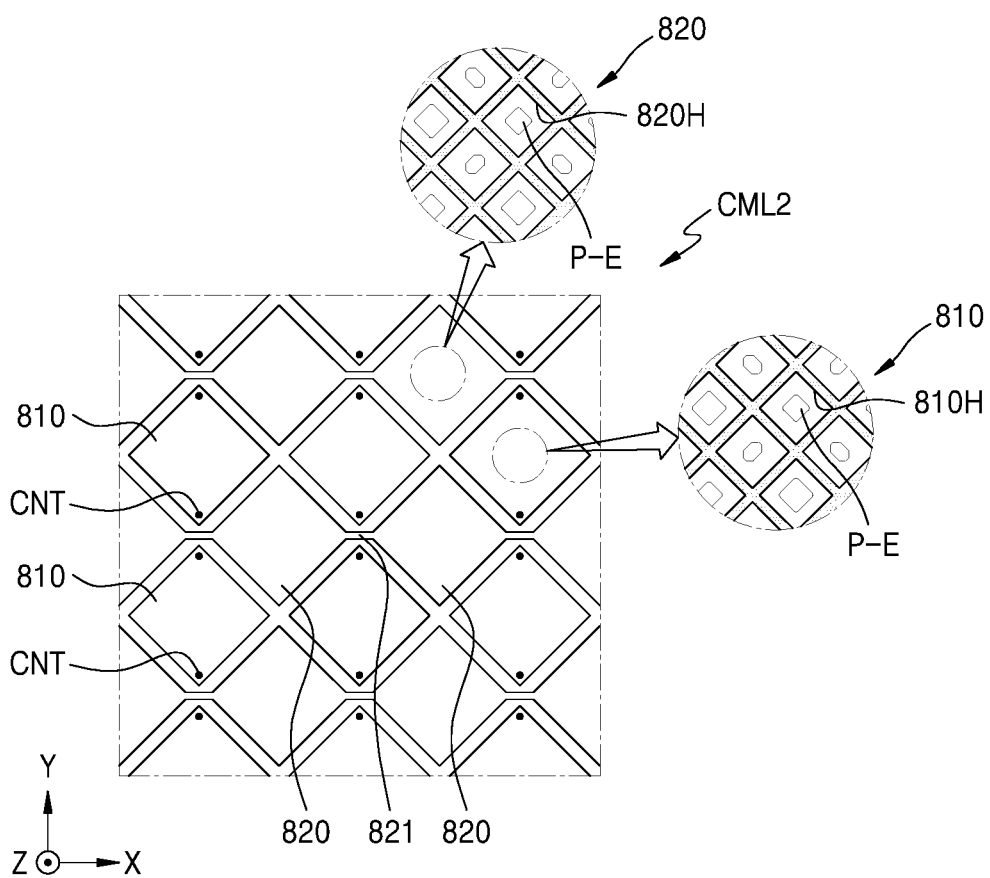
FIG. 20 is a schematic plan view of a portion of a second conductive layer of FIG. 18 according to an embodiment.

FIG. 17 is a schematic plan view of a sensor electrode layer included in a display apparatus according to an embodiment. FIG. 18 is a cross-sectional view of the display apparatus taken along sectional line VIII-VIII' of FIG. 17 according to an embodiment. FIG. 19 is a schematic plan view of a portion of a first conductive layer of FIG. 18 according to an embodiment. FIG. 20 is a schematic plan view of a portion of a second conductive layer of FIG. 18 according to an embodiment.

The display apparatus according to an embodiment may include a sensor electrode layer SENL that senses a touch input of a user. Referring to FIG. 17, the sensor electrode layer SENL includes a sensor area TSA for sensing a user's touch, and a sensor peripheral area TPA around the sensor area TSA. The display apparatus including the lower substrate 100 includes the display area DA of FIG. 1 and the peripheral region PA of FIG. 1 outside the display area DA as described above, and the sensor area TSA may be understood as overlapping the display area DA and the sensor peripheral area TPA may be understood as overlapping the peripheral area PA.

Figure 21:
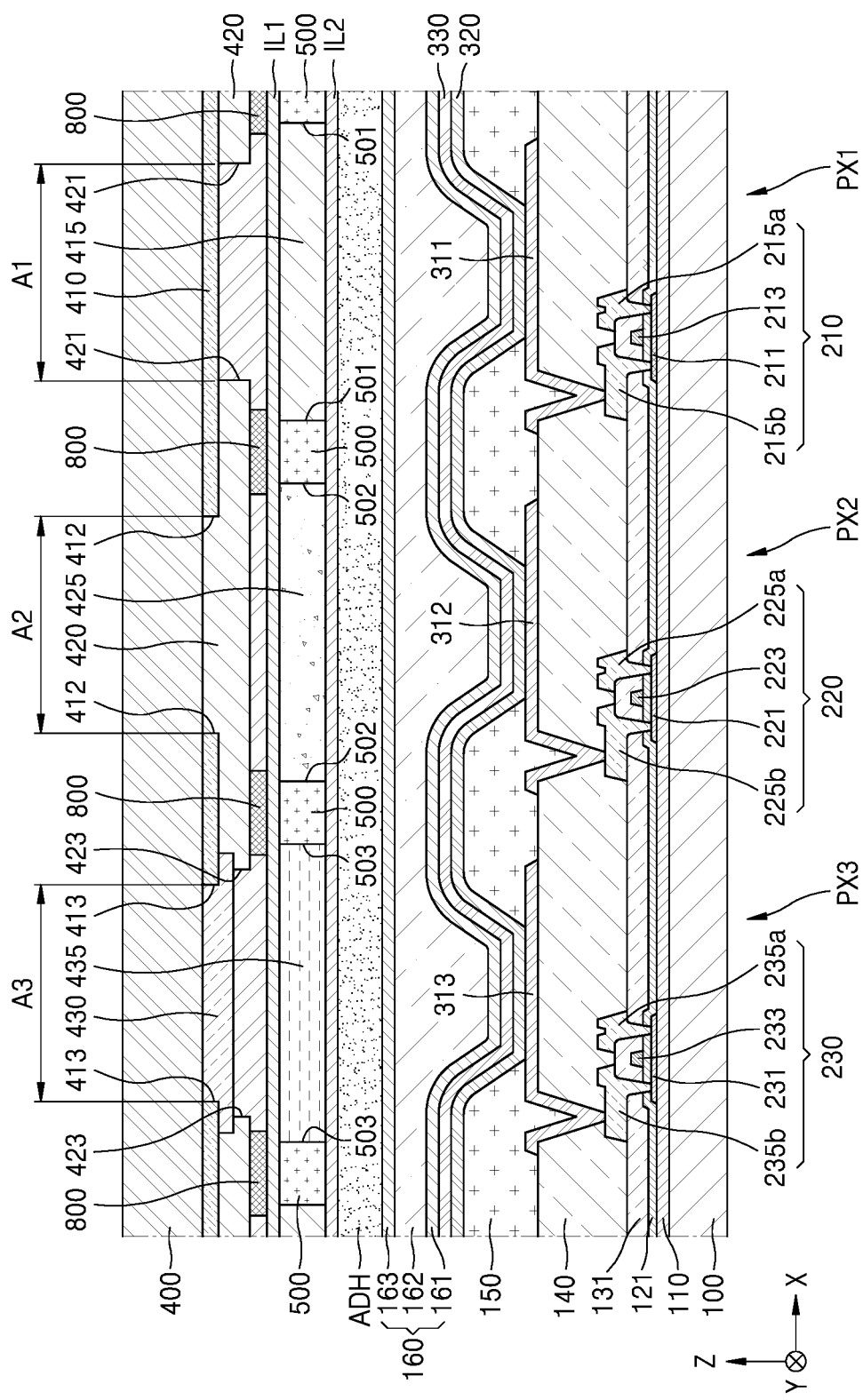
FIG. 21 is a schematic cross-sectional view of a portion of a display apparatus including a sensor electrode according to an embodiment.

The sensor electrode layer SENL may include two types of electrodes, for example, first sensor electrodes 810 and second sensor electrodes 820, as sensor electrodes 800 of FIG. 21. For instance, the sensor electrode layer SENL may include first sensor electrodes 810, first signal lines 815-1 through 815-4 connected to the first sensor electrodes 810, second sensor electrodes 820, and second signal lines 825-1 through 825-5 connected to the second sensor electrodes 820. The sensor electrode layer SENL may sense an external input according to a mutual capacitance method and/or a self-capacitance method.

The first sensor electrodes 810 may be arranged in a y-axis direction and the second sensor electrodes 820 may be arranged in an x-axis direction crossing the y-axis direction. First sensor electrodes 810 arranged in the y-axis direction may be connected to each other via first connection electrodes 811 each located between adjacent first sensor electrodes 810, and may form each of first sensing lines 810C1 through 810C4. Second sensor electrodes 820 arranged in the x-axis direction may be connected to each other via second connection electrodes 821 each located between adjacent second sensor electrodes 820, and may form each of second sensing lines 820R1 through 820R5. The first sensing lines 810C1 through 810C4 and the second sensing lines 820R1 through 820R5 may cross each other. For example, the first sensing lines 810C1 through 810C4 may be perpendicular to the second sensing lines 820R1 through 820R5.

The first sensing lines 810C1 through 810C4 and the second sensing lines 820R1 through 820R5 may be located on the sensor area TSA, and may be connected to a sensing signal pad 840 through the first and second signal lines 815-1 through 815-4 and 825-1 through 825-5 formed in the sensor peripheral area TPA. The first sensing lines 810C1 through 810C4 may be connected to the first signal lines 815-1 through 815-4, respectively, and the second sensing lines 820R1 through 820R5 may be connected to the second signal lines 825-1 through 825-5, respectively.

FIG. 17 illustrates that the first signal lines 815-1 through 815-4 are connected to each of the top and bottom of the first sensing lines 810C1 through 810C4. This structure may increase sensing sensitivity. However, embodiments are not limited thereto. According to another embodiment, the first signal lines 815-1 through 815-4 may be connected to only the top or bottom of the first sensing lines 810C1 through 810C4. The layout of the first and second signal lines 815-1 through 815-4 and 825-1 through 825-5 may vary according to, for example, the shape or size of the sensor area TSA or a sensing method of the sensor electrode layer SENL.

The sensor electrode layer SENL may include a plurality of conductive layers. As shown in FIG. 18, the sensor electrode layer SENL may include a first conductive layer CML1 and a second conductive layer CML2 located on the display unit DU. A first insulating layer 81 may be located between the first conductive layer CML1 and the display unit DU, a second insulating layer 83 may be located between the first conductive layer CML1 and the second conductive layer CML2, and a third insulating layer 85 may be located on the second conductive layer CML2.

According to an embodiment, the first and second insulating layers 81 and 83 may be inorganic insulating layers, such as silicon nitride, and the third insulating layer 85 may be an organic insulating layer. FIG. 18 illustrates that the first insulating layer 81 is located between the display unit DU and the first conductive layer CML1. However, according to another embodiment, the first insulating layer 81 may be omitted, and the first conductive layer CML1 may be located directly on the display unit DU. According to another embodiment, the first and second insulating layers 81 and 83 may be organic insulating layers.

The first conductive layer CML1 may include first connection electrodes 811 as shown in FIGS. 18 and 19. As shown in FIGS. 18 and 20, the second conductive layer CML2 may include the first sensor electrodes 810, the second sensor electrodes 820, and second connection electrodes 821. The second sensor electrodes 820 may be electrically connected to each other by the second connection electrodes 821 provided on the same layer as the layer on which the second sensor electrodes 820 are provided. The first sensor electrodes 810 may be electrically connected to each other by the first connection electrodes 811 provided on a different layer as the layer on which the first sensor electrodes 810 are provided. The first connection electrode 811 electrically connecting neighboring first sensor electrodes 810 may be connected to the neighboring first sensor electrodes 810 through a contact hole CNT provided in the second insulating layer 83.

The first and second conductive layers CML1 and CML2 may include a metal. For example, each of the first and second conductive layers CML1 and CML2 may include, for example, at least one of Mo, Al, Cu, and Ti, and may have a multi-layered or single-layered structure including the aforementioned materials. According to an embodiment, each of the first and second conductive layers CML1 and CML2 may have a multi-layered structure of Ti/Al/Ti.

Referring to the magnified view of FIG. 20, each first sensor electrode 810 may have a grid structure (or a lattice structure) including a plurality of holes 810H. Each of the plurality of holes 810H may be located to overlap an emission area P-E of a pixel. Similarly, each second sensor electrode 820 may have a grid structure (or a lattice structure) including a plurality of holes 820H. Each of the plurality of holes 820H may be located to overlap an emission area P-E of a pixel.

Although FIGS. 18 through 20 illustrate a case where the first sensor electrodes 810 and the first connection electrodes 811 are located on different layers, embodiments are not limited thereto. According to another embodiment, the first sensor electrodes 810 and the first connection electrodes 811 may be located on the same layer (for example, the second conductive layer CML2), and the second sensor electrodes 820 and the second connection electrodes 821 may be located on different layers and may contact each other via contact holes penetrating through the second insulating layer 83.

In addition, although the first and second sensor electrodes 810 and 820 are included in the second conductive layer CML2 in FIGS. 18 through 20, embodiments are not limited thereto. According to another embodiment, the first sensor electrodes 810 and the second sensor electrodes 820 may be located on different layers. For example, one of the first and second sensor electrodes 810 and 820 may be located on the first conductive layer CML1, and the other may be located on the second conductive layer CML2.

Figure 22:
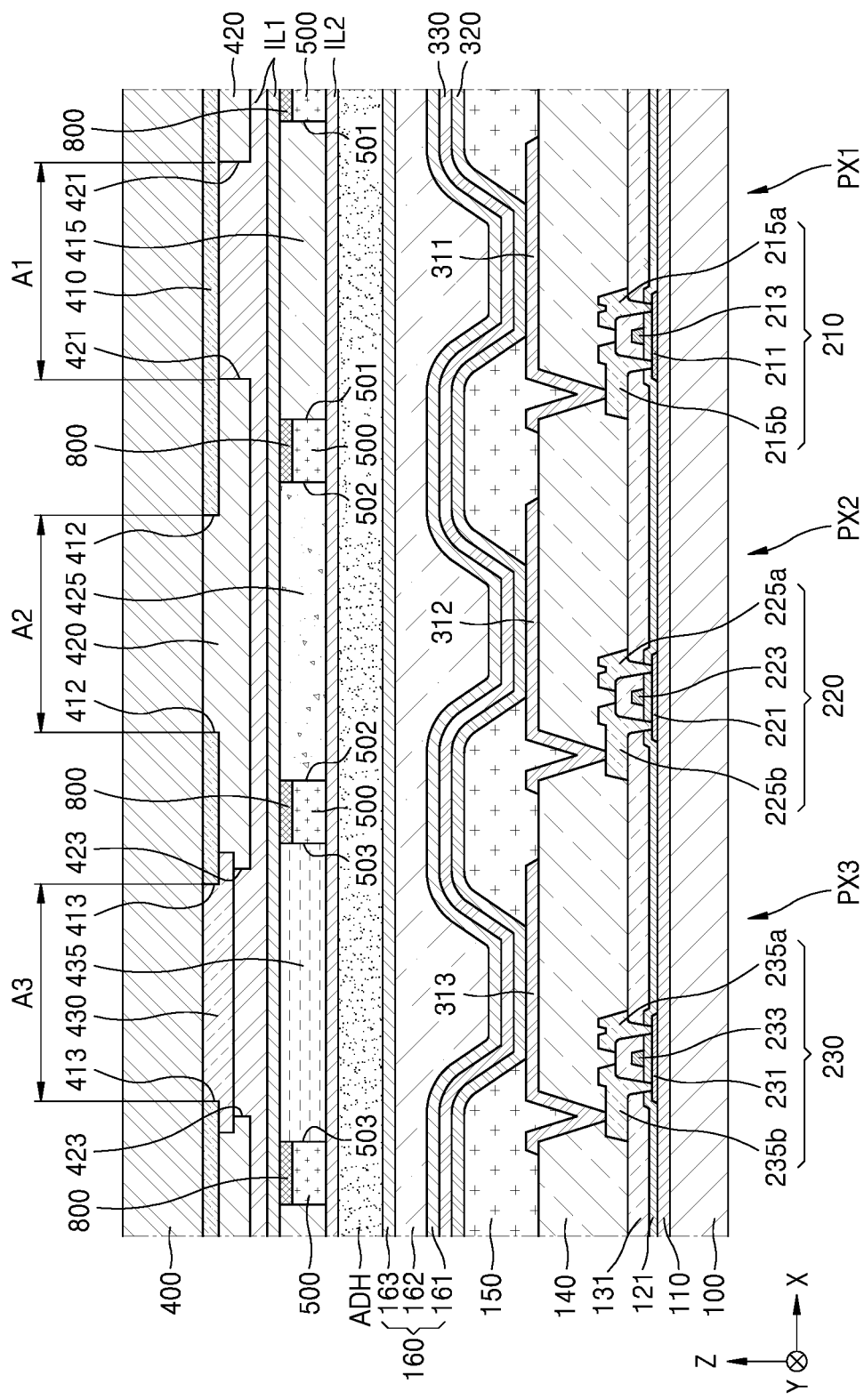
FIG. 22 is a schematic cross-sectional view of a portion of a display apparatus including a sensor electrode according to an embodiment.
Figure 23:
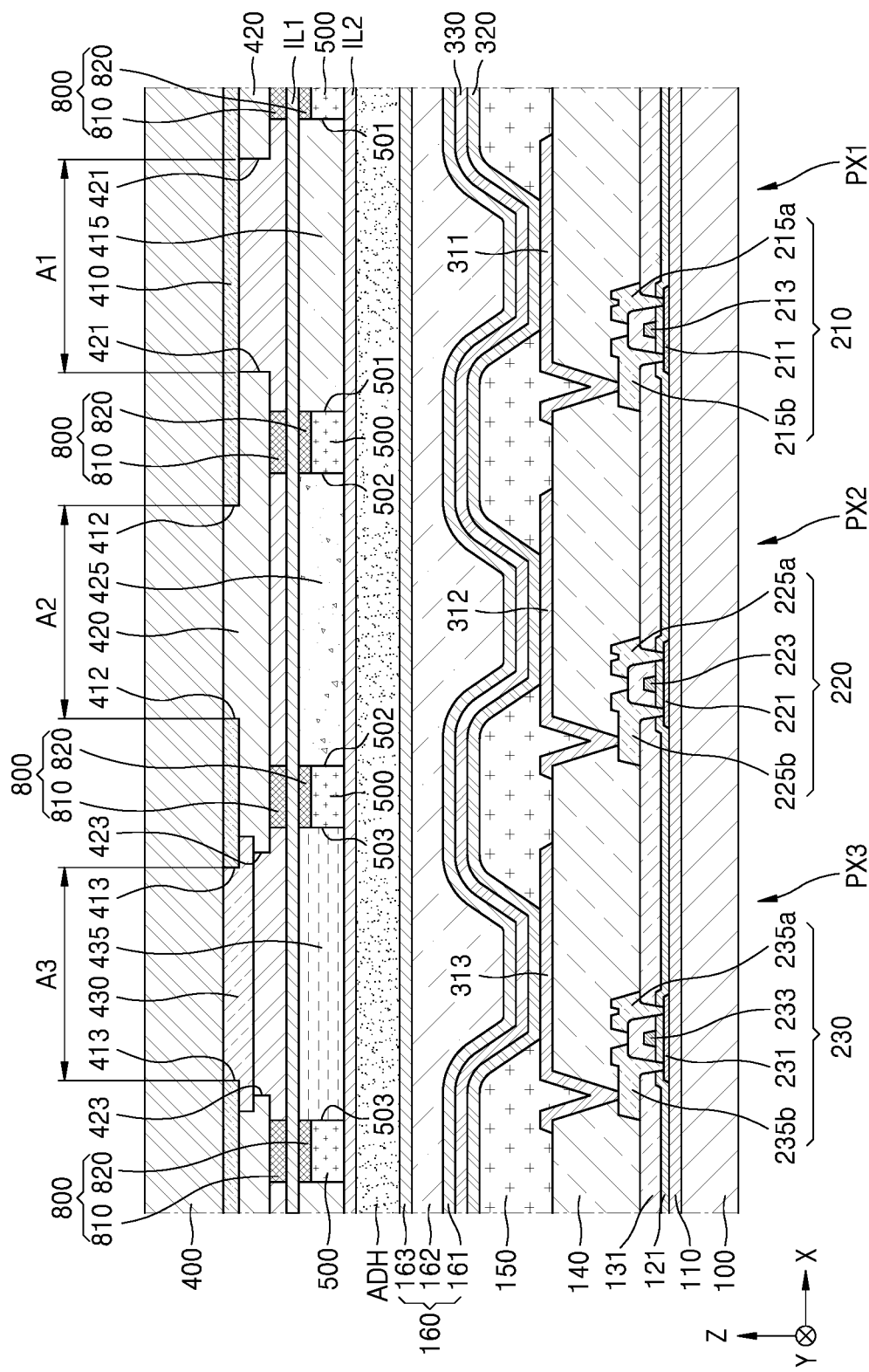
FIG. 23 is a schematic cross-sectional view of a portion of a display apparatus including a sensor electrode according to an embodiment.
Figure 24:
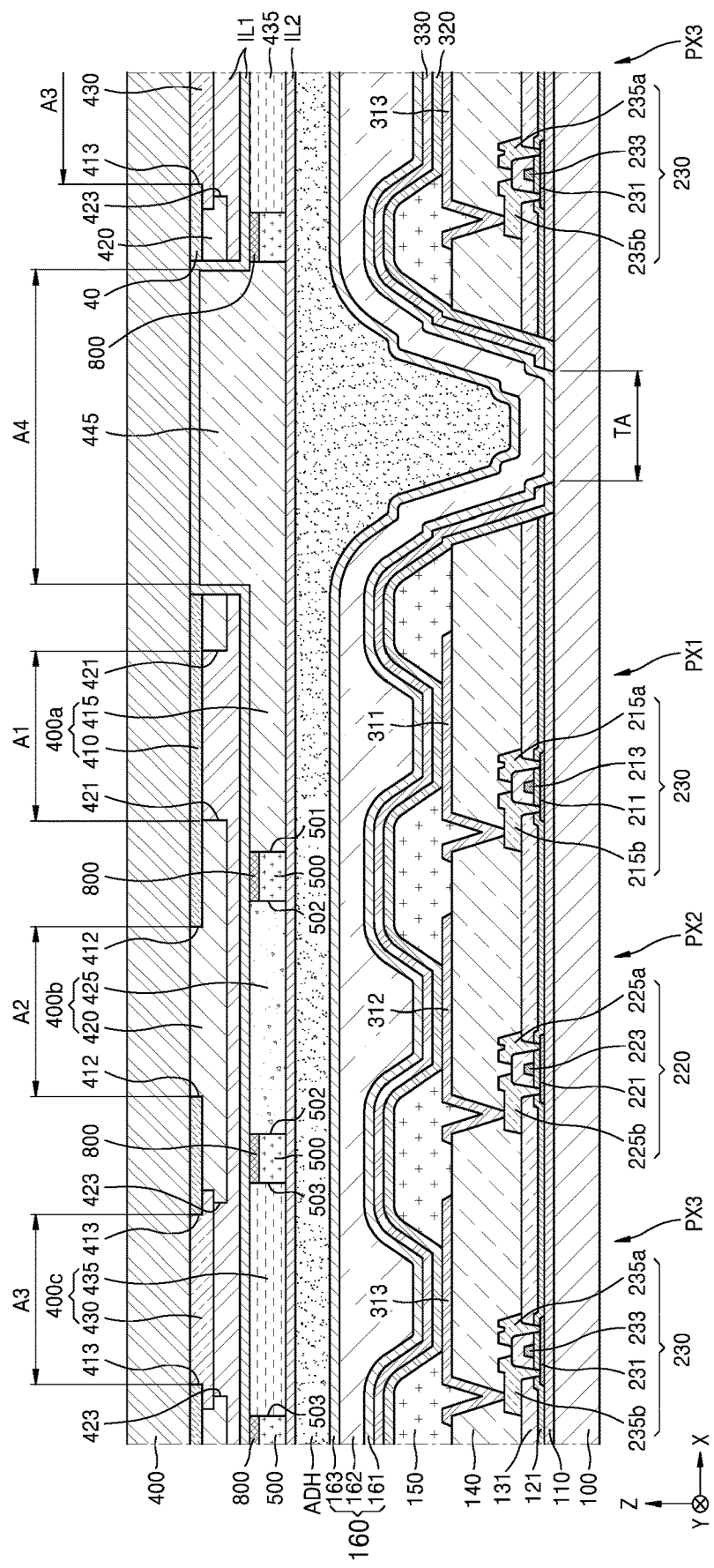
FIG. 24 is a schematic cross-sectional view of a portion of a display apparatus including a sensor electrode according to an embodiment.

FIG. 21 is a schematic cross-sectional view of a portion of a display apparatus including the sensor electrodes 800 according to an embodiment. FIG. 22 is a schematic cross-sectional view of a portion of a display apparatus including the sensor electrodes 800 according to an embodiment. FIG. 23 is a schematic cross-sectional view of a portion of a display apparatus including the sensor electrodes 800 according to an embodiment. FIG. 24 is a schematic cross-sectional view of a portion of a display apparatus including the sensor electrodes 800 according to an embodiment.

As shown in FIGS. 21 through 24, a display apparatus according to various embodiments may further include the sensor electrode layer SENL described above with reference to FIGS. 17 through 20. For instance, the display apparatus may further include the sensor electrodes 800 including the first and second sensor electrodes 810 and 820 of FIG. 17 of the sensor electrode layer SENL. The display apparatus may be implemented as a touch display apparatus by including the sensor electrodes 800. The touch display apparatus refers to a display apparatus capable of functioning as one of input devices providing input interfaces between the display apparatus and a user, as well as functioning as one of output devices providing output interfaces between the display apparatus and the user.

The sensor electrodes 800 may be located to surround at least a portion of the first area A1, at least a portion of the second area A2, and at least a portion of the third area A3.

According to an embodiment, as shown in FIG. 21, the sensor electrodes 800 may surround at least a portion of the first area A1, at least a portion of the second area A2, and at least a portion of the third area A3, and may be located between the upper substrate 400 and the first protective layer IL1. For example, the sensor electrodes 800 may surround at least a portion of the first area A1, at least a portion of the second area A2, and at least a portion of the third area A3, and may be located on the upper surface of the first protective layer IL1 in a direction toward the upper substrate 400. This may be understood as the sensor electrodes 800 being located on the upper surface of the first protective layer IL1 in the direction toward the upper substrate 400, between the first area A1 and the second area A2, between the second area A2 and the third area A3, and between the third area A3 and the first area A1, respectively, according to a cross-sectional view.

According to another embodiment, as shown in FIG. 22, the sensor electrodes 800 may surround at least a portion of the first area A1, at least a portion of the second area A2, and at least a portion of the third area A3, and may be located between the first protective layer IL1 and the second protective layer IL2. For instance, the sensor electrodes 800 may surround at least a portion of the first area A1, at least a portion of the second area A2, and at least a portion of the third area A3, and may be located on the lower surface of the first protective layer IL1 in a direction toward the lower substrate 100. This may be understood as the sensor electrodes 800 being located on the lower surface of the first protective layer IL1 in the direction toward the lower substrate 100, between the first area A1 and the second area A2, between the second area A2 and the third area A3, and between the third area A3 and the first area A1, respectively, according to a cross-sectional view.

According to another embodiment, the first sensor electrodes 810 and the second sensor electrodes 820 included in the sensor electrodes 800 may have different layered structures. For example, as shown in FIG. 23, the first sensor electrodes 810 may surround at least a portion of the first area A1, at least a portion of the second area A2, and at least a portion of the third area A3, and may be located between the upper substrate 400 and the first protective layer IL1. The second sensor electrodes 820 may surround at least a portion of the first area A1, at least a portion of the second area A2, and at least a portion of the third area A3, and may be located between the first protective layer IL1 and the second protective layer IL2. For example, the first sensor electrodes 810 may surround at least a portion of the first area A1, at least a portion of the second area A2, and at least a portion of the third area A3, and may be located on the upper surface of the first protective layer IL1 in a direction toward the upper substrate 400. The second sensor electrodes 820 may surround at least a portion of the first area A1, at least a portion of the second area A2, and at least a portion of the third area A3, and may be located on the lower surface of the first protective layer IL1 in a direction toward the lower substrate 100. According to another embodiment, the first sensor electrodes 810 and the second sensor electrodes 820 may be arranged opposite to the above-described arrangement. In other words, the first sensor electrodes 810 may be located on the lower surface of the first protective layer IL1 in a direction toward the lower substrate 100, and the second sensor electrodes 820 may be located on the upper surface of the first protective layer IL1 in a direction toward the upper substrate 400.

FIG. 24 illustrates a case where a display apparatus including transmission areas TA further includes the sensor electrodes 800 described above with reference to FIG. 22. In this case, the display apparatus may perform a function of the above-described transparent display apparatus and a function of the above-described touch display apparatus at the same time. For instance, the display apparatus according to some embodiments may be a display apparatus capable of performing a function as an input device providing an input interface between the display apparatus and a user, as well as a function of a transparent display apparatus capable of simultaneously recognizing an image displayed due to light emission by the light-emitting diodes of the display apparatus and light beams transmitted by the display apparatus through the transmission areas TA.

Although FIG. 24 illustrates that the display apparatus described in association with FIG. 9 further includes the sensor electrodes 800, the display apparatus described in association with FIG. 10 may further include the sensor electrodes 800. Although FIG. 24 illustrates a case where the display apparatus includes the sensor electrodes 800 described above with reference to FIG. 22, the display apparatus may include the sensor electrodes 800 described above with reference to FIG. 21 or the sensor electrodes 800 described above with reference to FIG. 23.

Although only a display apparatus has been described above, embodiments are not limited thereto. For example, a method of manufacturing a display apparatus according to a structure of a display apparatus is also within the purview of the disclosure.

According to various embodiments, a display apparatus having relatively high luminescent efficiency may be realized.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display apparatus comprising:
a lower substrate comprising a display area and a transmission area;
first, second, and third pixel electrodes above the lower substrate in the display area;
an intermediate layer comprising emission layers stacked above each of the first, second, and third pixel electrodes, the intermediate layer having an opening corresponding to the transmission area;
an opposite electrode above the intermediate layer, the opposite electrode having an opening corresponding to the transmission area;
an upper substrate having a lower surface above the lower substrate and facing the lower substrate, the upper substrate comprising a first area corresponding to the first pixel electrode, a second area corresponding to the second pixel electrode, a third area corresponding to the third pixel electrode, and a fourth area corresponding to the transmission area;
a second-color quantum dot layer between the upper substrate and the opposite electrode in the second area;
a third-color quantum dot layer between the upper substrate and the opposite electrode in the third area;
a light-transmissive layer between the upper substrate and the opposite electrode in the first area and between the second-color quantum dot layer and the third-color quantum dot layer; and
a light-transmissive material layer between the upper substrate and the lower substrate in the fourth area, the light-transmissive material layer being integrally formed with the light-transmissive layer.

2. The display apparatus of claim 1, wherein the light-transmissive material layer and the light-transmissive layer comprise a same material.

3. The display apparatus of claim 1, wherein the emission layers comprise a first-color emission layer and a second-color emission layer.

4. The display apparatus of claim 3, wherein the intermediate layer further comprises a charge generation layer between the emission layers.

5. The display apparatus of claim 3, wherein, when viewed in a direction perpendicular to an upper surface of the lower substrate, an area of the first area is equal to an area of the second area.

6. The display apparatus of claim 1, further comprising:
a first reflective layer between the upper substrate and the light-transmissive material layer in the transmission area.

7. The display apparatus of claim 1, further comprising:
a first-color filter layer between the upper substrate and the light-transmissive layer in the first area, the first-color filter layer having a 1-2nd opening exposing the second area, a 1-3rd opening exposing the third area, and 1-4th opening exposing the fourth area;
a second-color filter layer between the upper substrate and the second-color quantum dot layer in the second area, the second-color filter layer comprising a portion that fills the 1-2nd opening and a portion on a lower surface of the first-color filter layer in a direction toward the lower substrate; and
a third-color filter layer between the upper substrate and the third-color quantum dot layer in the third area, the third-color filter layer filling the 1-3rd opening.

8. The display apparatus of claim 7, further comprising:
a second reflective layer between the upper substrate and the first-color filter layer in the first area.

9. The display apparatus of claim 7, further comprising:
a second reflective layer on a lower surface of the first-color filter layer in the direction toward the lower substrate, in the first area.

10. The display apparatus of claim 7, further comprising:
a second reflective layer on a lower surface of the second-color filter layer in the direction toward the lower substrate, between the first area and the second area.

11. The display apparatus of claim 1, further comprising:

a first protective layer covering an upper surface of the light-transmissive layer in a direction toward the upper substrate; and a sensor electrode surrounding at least a portion of the first area, the sensor electrode being on an upper surface of the first protective layer in the direction toward the upper substrate.

12. The display apparatus of claim 1, further comprising:

a first protective layer covering an upper surface of the light-transmissive layer in a direction toward the upper substrate; and a sensor electrode surrounding at least a portion of the first area, the sensor electrode being on a lower surface of the first protective layer in a direction toward the lower substrate.

13. The display apparatus of claim 1, further comprising:

a first protective layer covering an upper surface of the light-transmissive layer in a direction toward the upper substrate;

a first sensor electrode surrounding at least a portion of the first area, the first sensor electrode being on an upper surface of the first protective layer in the direction toward the upper substrate; and a second sensor electrode overlapping the first sensor electrode, the second sensor electrode being on a lower surface of the first protective layer in a direction toward the lower substrate.

14. The display apparatus of claim 1, wherein the light-transmissive layer is spaced apart from the second-color quantum dot layer and the third-color quantum dot layer in plan view.

15. The display apparatus of claim 1, wherein there is a one-to-one correspondence between the fourth area and each of the first area, the second area, and the third area.

16. The display apparatus of claim 1, wherein the transmission area is transparent to visible light, and images behind the display apparatus are visible through the display apparatus while the display apparatus displays an image.

* * * * *